United States Patent
Kao et al.

(10) Patent No.: US 11,757,020 B2
(45) Date of Patent: Sep. 12, 2023

(54) SEMICONDUCTOR DEVICE AND METHOD

(71) Applicant: Taiwan Semiconductor Manufacturing Co., Ltd., Hsinchu (TW)

(72) Inventors: Wan-Yi Kao, Baoshan Township (TW); Che-Hao Chang, Hsinchu (TW); Yung-Cheng Lu, Hsinchu (TW); Chi On Chui, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 56 days.

(21) Appl. No.: 16/941,445

(22) Filed: Jul. 28, 2020

(65) Prior Publication Data

US 2021/0242333 A1 Aug. 5, 2021

Related U.S. Application Data

(60) Provisional application No. 62/968,458, filed on Jan. 31, 2020.

(51) Int. Cl.
*H01L 29/78* (2006.01)
*H01L 21/8234* (2006.01)
(Continued)

(52) U.S. Cl.
CPC .... *H01L 29/66795* (2013.01); *H01L 21/0228* (2013.01); *H01L 21/823418* (2013.01);
(Continued)

(58) Field of Classification Search
CPC ......... H01L 29/66795; H01L 29/66545; H01L 29/7851; H01L 21/823418; H01L 21/823431; H01L 21/823475; H01L 21/76801; H01L 21/76828; H01L 21/76832; H01L 21/76834; H01L 21/02126; H01L 21/02164; H01L 29/785;
(Continued)

(56) References Cited

U.S. PATENT DOCUMENTS 5,536,330 A * 7/1996 Chen ................. C23C 14/564
34/410
9,443,757 B1 9/2016 Tsai et al.
(Continued)

FOREIGN PATENT DOCUMENTS

CN 109576677 * 4/2019
JP 2010-21378 * 1/2010 ........... H01L 21/318
(Continued)

*Primary Examiner* — Mary A Wilczewski
(74) *Attorney, Agent, or Firm* — Slater Matsil, LLP

(57) ABSTRACT

A method includes forming a fin extending from a substrate; forming an first isolation region along opposing sidewalls of the fin; forming a gate structure over the fin; forming an epitaxial source/drain region in the fin adjacent the gate structure; forming an etch stop layer over the epitaxial source/drain region and over the gate structure; forming a protection layer over the etch stop layer, the protection layer including silicon oxynitride; and forming a second isolation material over the protection layer, wherein forming the second isolation material reduces a nitrogen concentration of the protection layer.

20 Claims, 21 Drawing Sheets

(51) Int. Cl.
*H01L 21/336* (2006.01)
*H01L 29/66* (2006.01)
*H01L 21/02* (2006.01)
*H01L 29/417* (2006.01)
*H01L 21/385* (2006.01)
*H01L 21/8238* (2006.01)
*H01L 27/088* (2006.01)
*H01L 27/092* (2006.01)

(52) U.S. Cl.
CPC ........... *H01L 21/823431* (2013.01); *H01L 29/41791* (2013.01); *H01L 29/66545* (2013.01); *H01L 29/7851* (2013.01); *H01L 21/385* (2013.01); *H01L 21/823814* (2013.01); *H01L 21/823821* (2013.01); *H01L 27/0886* (2013.01); *H01L 27/0924* (2013.01); *H01L 29/785* (2013.01)

(58) Field of Classification Search
CPC ..... H01L 21/823821; H01L 21/823871; H01L 27/0886; H01L 27/0924; H01L 21/0228; H01L 21/3105; H01L 23/53295; H01L 21/385; H01L 29/41791
See application file for complete search history.

(56) References Cited

U.S. PATENT DOCUMENTS

| | | | |
|---|---|---|---|
| 9,985,023 B1* | 5/2018 | Liu | H01L 21/76897 |
| 10,269,649 B2 | 4/2019 | Wang et al. | |
| 10,269,655 B1 | 4/2019 | Lee et al. | |
| 2011/0034039 A1* | 2/2011 | Liang | H01L 21/02164 438/787 |
| 2015/0069473 A1* | 3/2015 | Glass | H01L 21/76805 257/288 |
| 2016/0013051 A1* | 1/2016 | Zeng | H01L 21/02323 438/795 |
| 2016/0351570 A1* | 12/2016 | Park | H01L 21/3081 |
| 2018/0219077 A1 | 8/2018 | Wang et al. | |
| 2019/0067027 A1 | 2/2019 | Wang et al. | |
| 2019/0103265 A1 | 4/2019 | Kao et al. | |
| 2019/0103277 A1* | 4/2019 | Luan | H01L 29/66795 |
| 2019/0131436 A1 | 5/2019 | Cheng et al. | |
| 2019/0157075 A1* | 5/2019 | Tu | H01L 21/02274 |
| 2019/0164819 A1 | 5/2019 | Chou | |
| 2019/0333812 A1* | 10/2019 | Seong | H01L 29/7851 |
| 2020/0006063 A1 | 1/2020 | Chen et al. | |
| 2020/0006558 A1 | 1/2020 | Wu et al. | |
| 2020/0098890 A1* | 3/2020 | Wu | H01L 29/6656 |
| 2020/0135551 A1* | 4/2020 | Hsu | H01L 21/02271 |
| 2020/0161123 A1* | 5/2020 | Kao | C23C 16/045 |
| 2020/0365454 A1* | 11/2020 | Kao | H01L 29/785 |
| 2021/0242333 A1* | 8/2021 | Kao | H01L 21/823431 |
| 2021/0367063 A1* | 11/2021 | Kao | H01L 21/02326 |
| 2022/0246478 A1 | 8/2022 | Kao et al. | |
| 2022/0301868 A1 | 9/2022 | Kao et al. | |

FOREIGN PATENT DOCUMENTS

| | | |
|---|---|---|
| KR | 20190024567 | 3/2019 |
| KR | 20190062205 | 6/2019 |
| KR | 20200002570 A | 1/2020 |
| KR | 20200002644 A | 1/2020 |

* cited by examiner

SEMICONDUCTOR DEVICE AND METHOD

PRIORITY CLAIM AND CROSS-REFERENCE

This application claims the benefit of U.S. Provisional Application No. 62/968,458, filed on Jan. 31, 2020, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
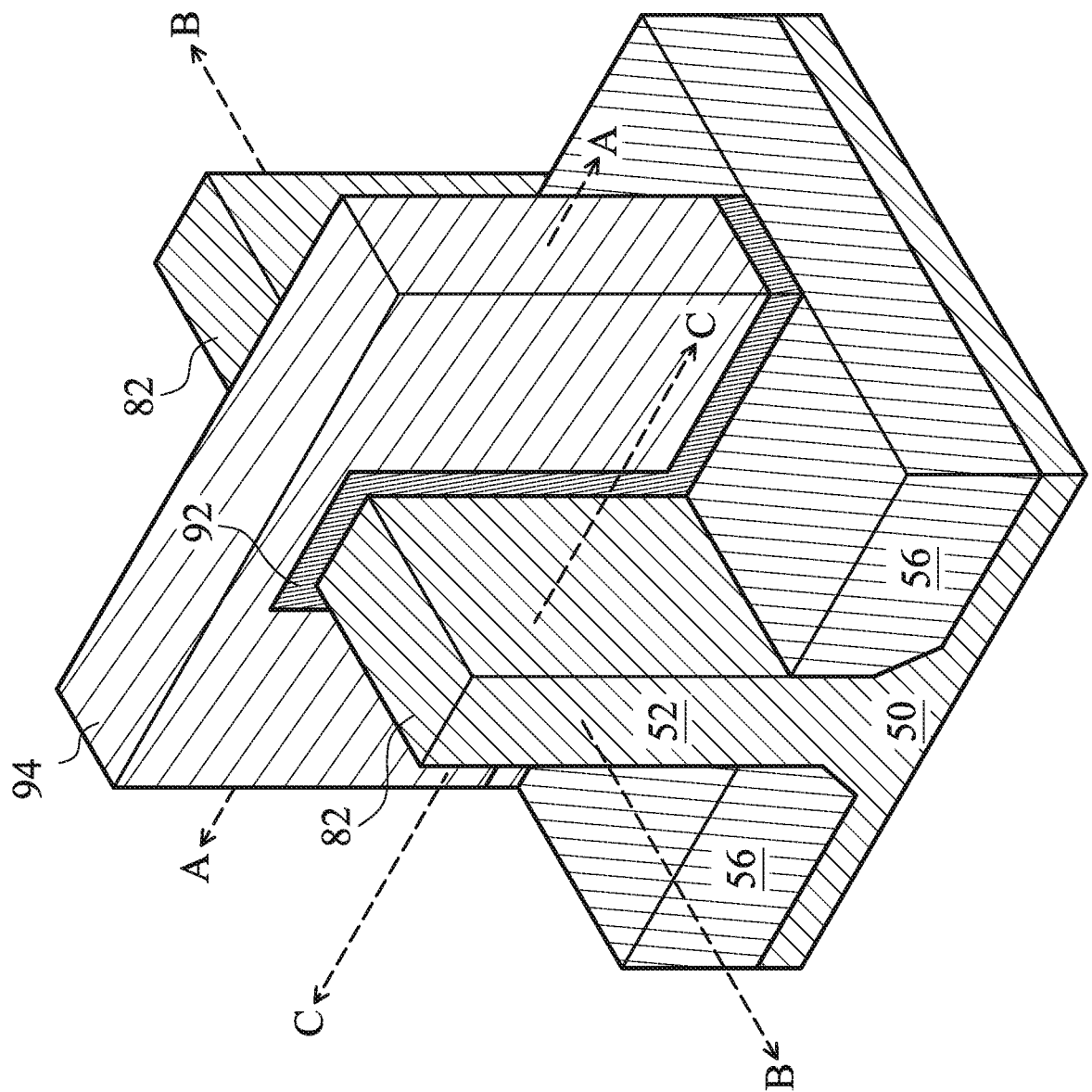
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A method of forming a protection layer over the source/drain regions of a transistor device (e.g., a FinFET) is provided in accordance with various embodiments. The intermediate stages in the formation of the protection layer are illustrated in accordance with some embodiments. Some variations of some embodiments are discussed. The protection layer may be a dielectric layer such as silicon oxynitride that is formed over an etch stop layer. The protection layer can reduce or prevent damage to the source/drain regions during subsequent processing steps. For example, the protection layer can reduce or prevent oxidation of the source/drain regions during the formation of an interlayer dielectric (ILD) layer. The protection layer can allow for a thinner etch stop layer to be used without increased risk of damage to the source/drain regions. A thinner etch stop layer can improve reproducibility and reliability of the formation of source/drain contacts, in some cases. An annealing process may be performed to reduce the nitrogen content of the protection layer, which can allow for easier etching of the protection layer. The annealing process may be part of the ILD layer formation process. In this manner, the source/drain regions can be protected by the protection layer without significantly impacting the formation of the contacts to the source/drain regions. In addition, the protection layer allows the formation of a thinner contact etch stop layer (CESL), which can provide a better metal landing (MD) window on the thinner CESL.

FIG. 1 illustrates an example of a FinFET in a three-dimensional view, in accordance with some embodiments. The FinFET comprises a fin 52 on a substrate 50 (e.g., a semiconductor substrate). Isolation regions 56 are disposed in the substrate 50, and the fin 52 protrudes above and from between neighboring isolation regions 56. Although the isolation regions 56 are described/illustrated as being separate from the substrate 50, as used herein the term "substrate" may be used to refer to just the semiconductor substrate or a semiconductor substrate inclusive of isolation regions. Additionally, although the fin 52 is illustrated as a single, continuous material as the substrate 50, the fin 52 and/or the substrate 50 may comprise a single material or a plurality of materials. In this context, the fin 52 refers to the portion extending between the neighboring isolation regions 56.

A gate dielectric layer 92 is along sidewalls and over a top surface of the fin 52, and a gate electrode 94 is over the gate dielectric layer 92. Source/drain regions 82 are disposed in opposite sides of the fin 52 with respect to the gate dielectric layer 92 and gate electrode 94. FIG. 1 further illustrates reference cross-sections that are used in later figures. Cross-section A-A is along a longitudinal axis of the gate electrode 94 and in a direction, for example, perpendicular to the direction of current flow between the source/drain regions 82 of the FinFET. Cross-section B-B is perpendicular to cross-section A-A and is along a longitudinal axis of the fin 52 and in a direction of, for example, a current flow between the source/drain regions 82 of the FinFET. Cross-section C-C is parallel to cross-section A-A and extends through a source/drain region of the FinFET. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs.

FIGS. 2 through 17B are cross-sectional views of intermediate stages in the manufacturing of FinFETs, in accordance with some embodiments. FIGS. 2 through 7 illustrate reference cross-section A-A illustrated in FIG. 1, except for multiple fins/FinFETs. FIGS. 8A, 9A, 10A, 11A, 12A, 13A, 14A, 15A, 16A, and 17A are illustrated along reference cross-section A-A illustrated in FIG. 1, and FIGS. 8B, 9B, 10B, 11B, 12B, 13B, 14B, 15B, 15C, 16B, and 17B are illustrated along a similar cross-section B-B illustrated in FIG. 1, except for multiple fins/FinFETs. FIGS. 10C and 10D are illustrated along reference cross-section C-C illustrated in FIG. 1, except for multiple fins/FinFETs.

Figure 2:
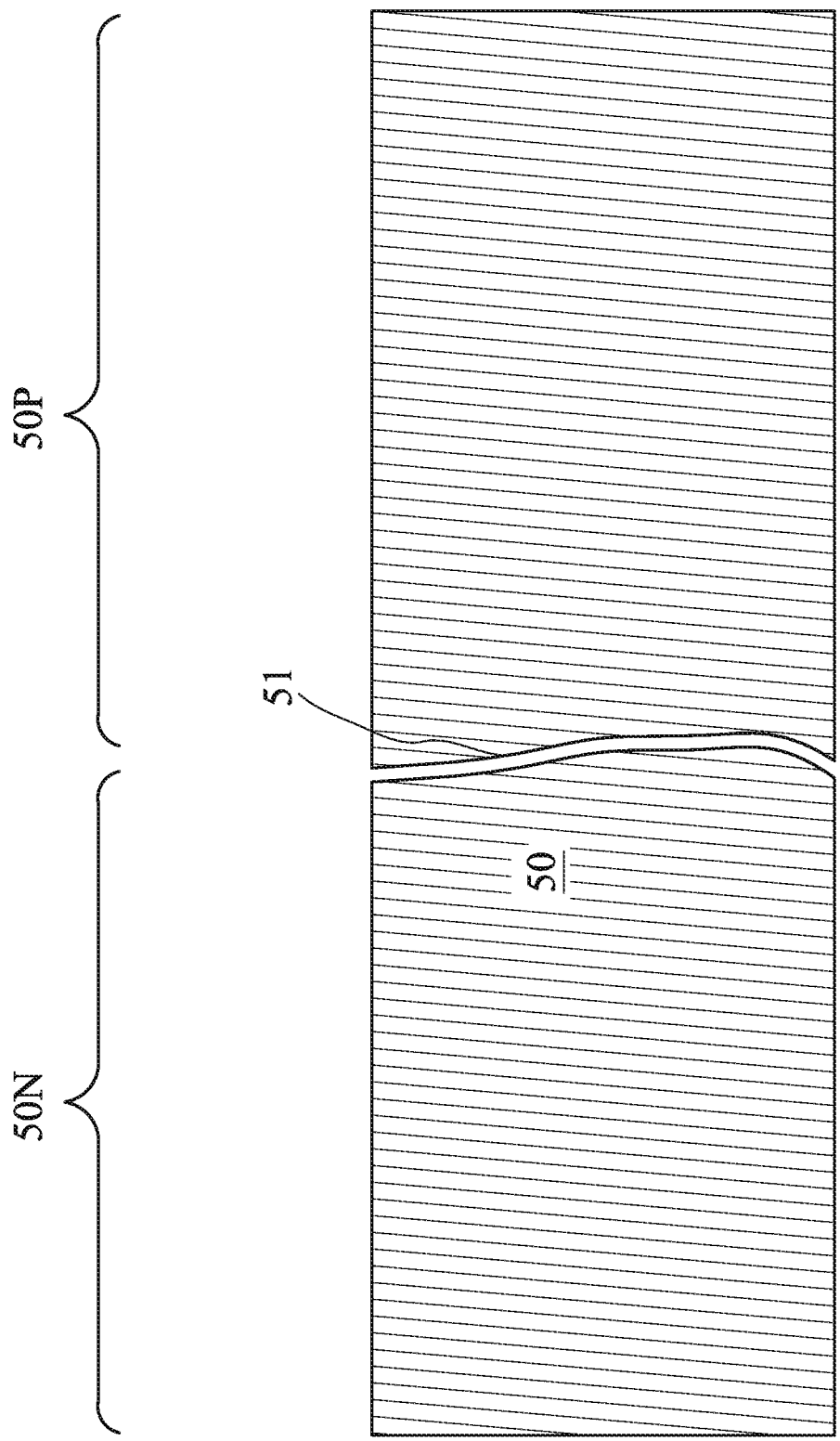
FIGS. 2, 3, 4, 5, 6, 7, 8A, 8B, 9A, 9B, 10A, 10B, 10C, 10D, 11A, 11B, 12A, 12B, 13A, 13B, 14A, 14B, 15A, 15B, 15C, 16A, 16B, 17A, and 17B are cross-sectional views of intermediate stages in the manufacturing of FinFETs, in accordance with some embodiments.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has a region 50N and a region 50P. The region 50N can be for forming n-type devices, such as NMOS transistors, e.g., n-type FinFETs. The region 50P can be for forming p-type devices, such as PMOS transistors, e.g., p-type FinFETs. The region 50N may be physically separated from the region 50P (as illustrated by divider 51), and any number of device features (e.g., other active devices, doped regions, isolation structures, etc.) may be disposed between the region 50N and the region 50P.

Figure 3:
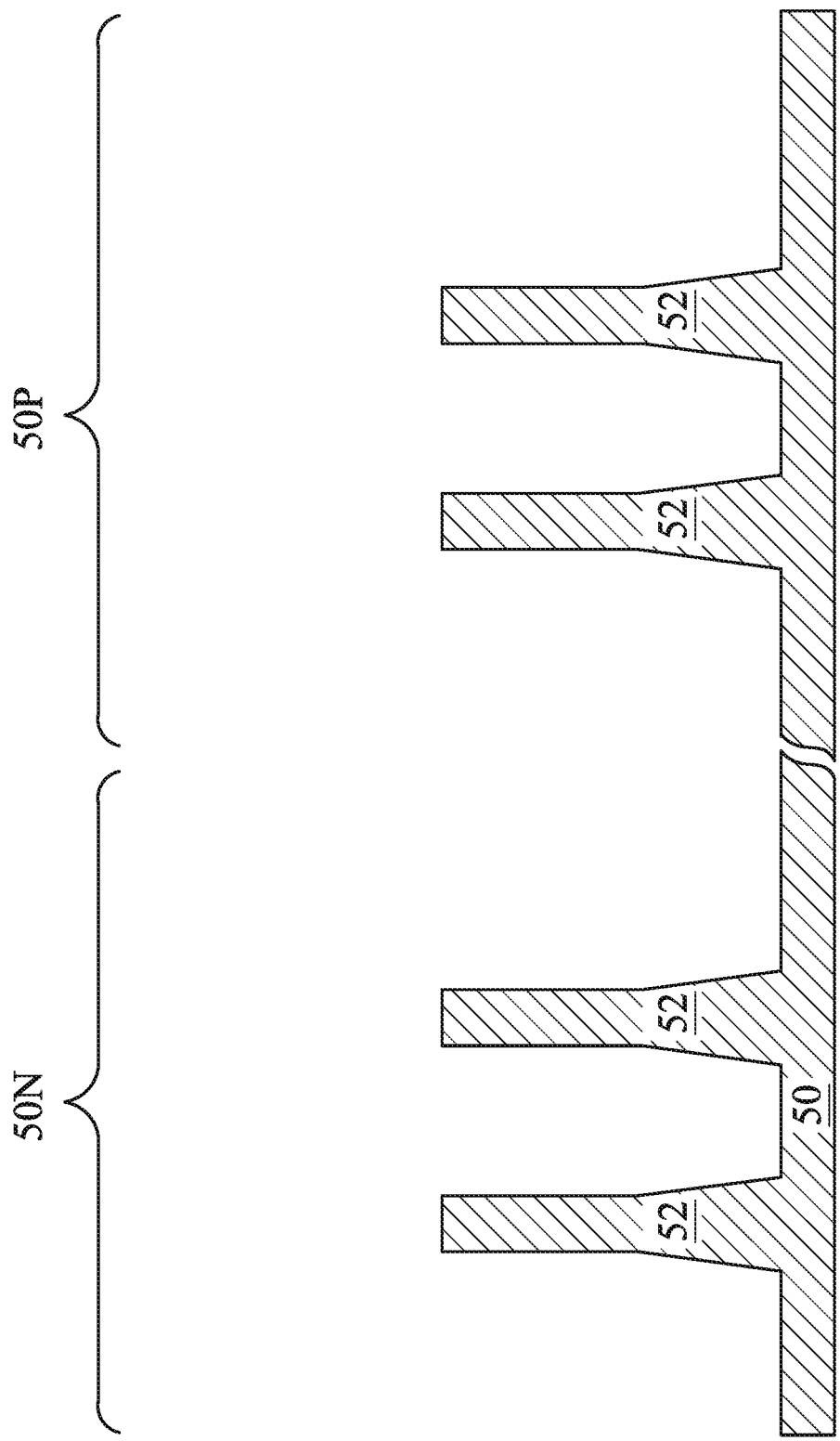

In FIG. 3, fins 52 are formed in the substrate 50. The fins 52 are semiconductor strips. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etch may be anisotropic.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. In some embodiments, the mask (or other layer) may remain on the fins 52.

Figure 4:
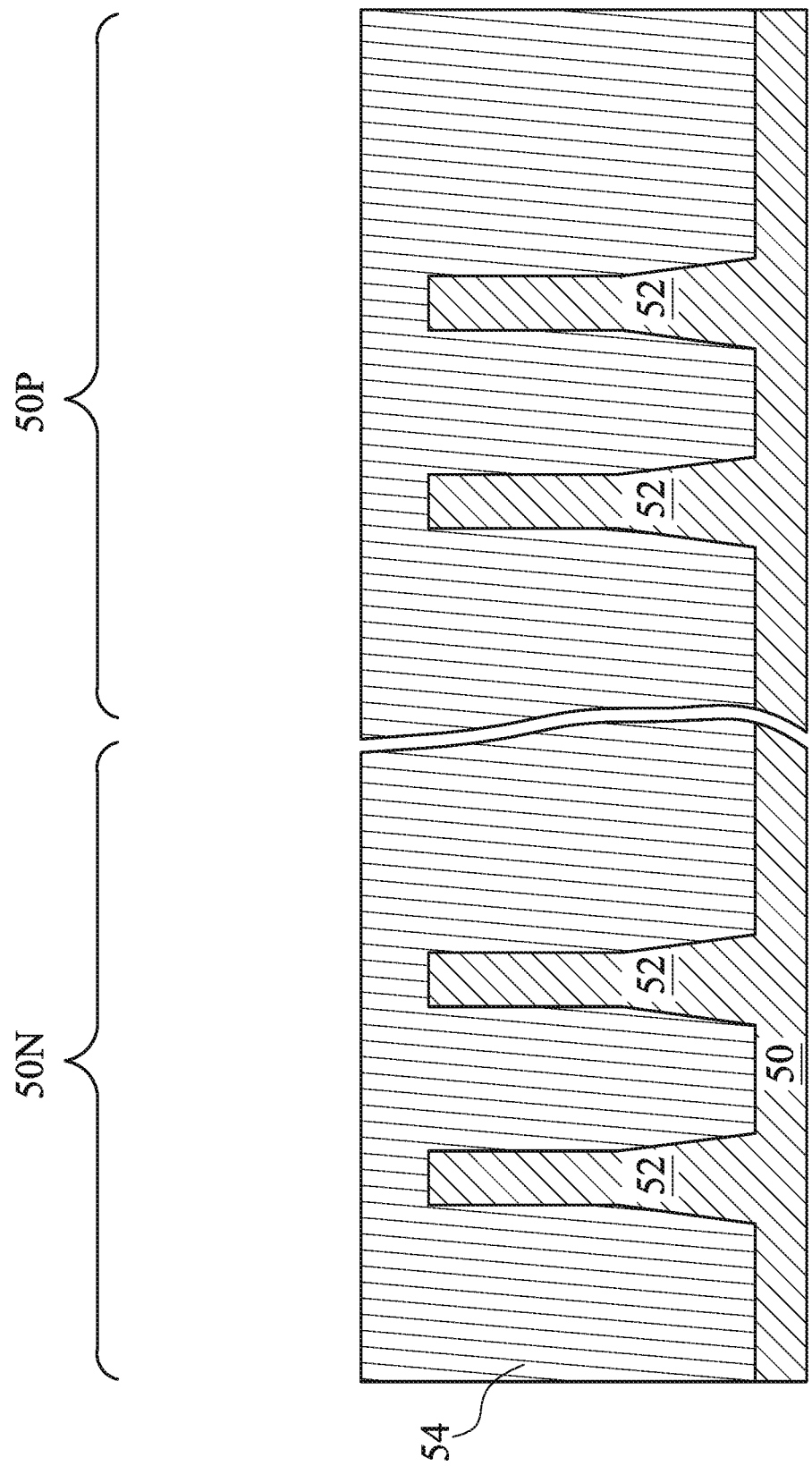

In FIG. 4, an insulation material 54 is formed over the substrate 50 and between neighboring fins 52. The insulation material 54 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material 54 is silicon oxide formed by a FCVD process. An anneal process may be performed once the insulation material is formed. In an embodiment, the insulation material 54 is formed such that excess insulation material 54 covers the fins 52. Although the insulation material 54 is illustrated as a single layer, some embodiments may utilize multiple layers. For example, in some embodiments a liner (not shown) may first be formed along a surface of the substrate 50 and the fins 52. Thereafter, a fill material, such as those discussed above may be formed over the liner.

Figure 5:
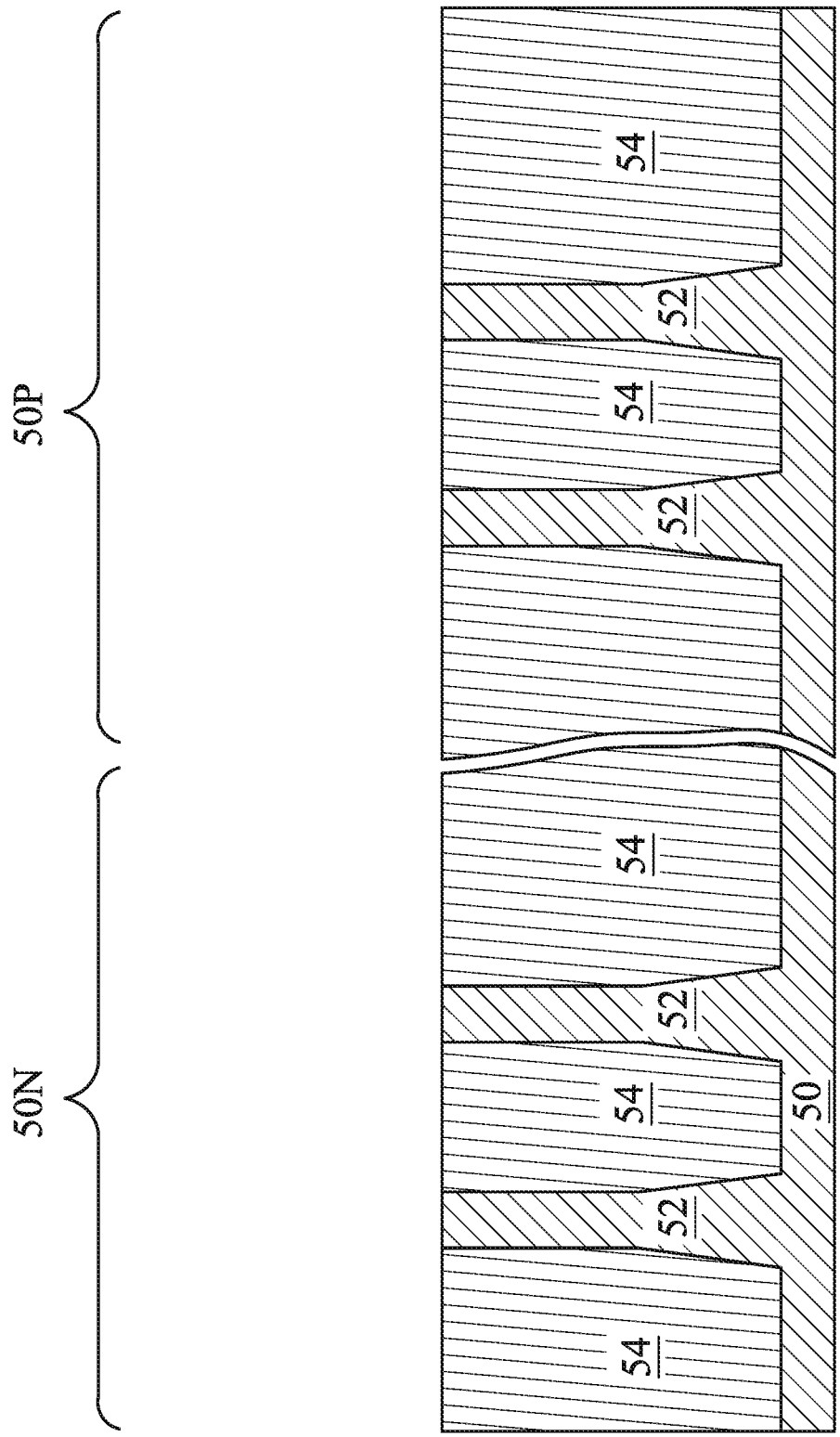

In FIG. 5, a removal process is applied to the insulation material 54 to remove excess insulation material 54 over the fins 52. In some embodiments, a planarization process such as a chemical mechanical polish (CMP), an etch-back process, combinations thereof, or the like may be utilized. The planarization process exposes the fins 52 such that top surfaces of the fins 52 and the insulation material 54 are level after the planarization process is complete. In embodiments in which a mask remains on the fins 52, the planarization process may expose the mask or remove the mask such that top surfaces of the mask or the fins 52, respectively, and the insulation material 54 are level after the planarization process is complete.

Figure 6:
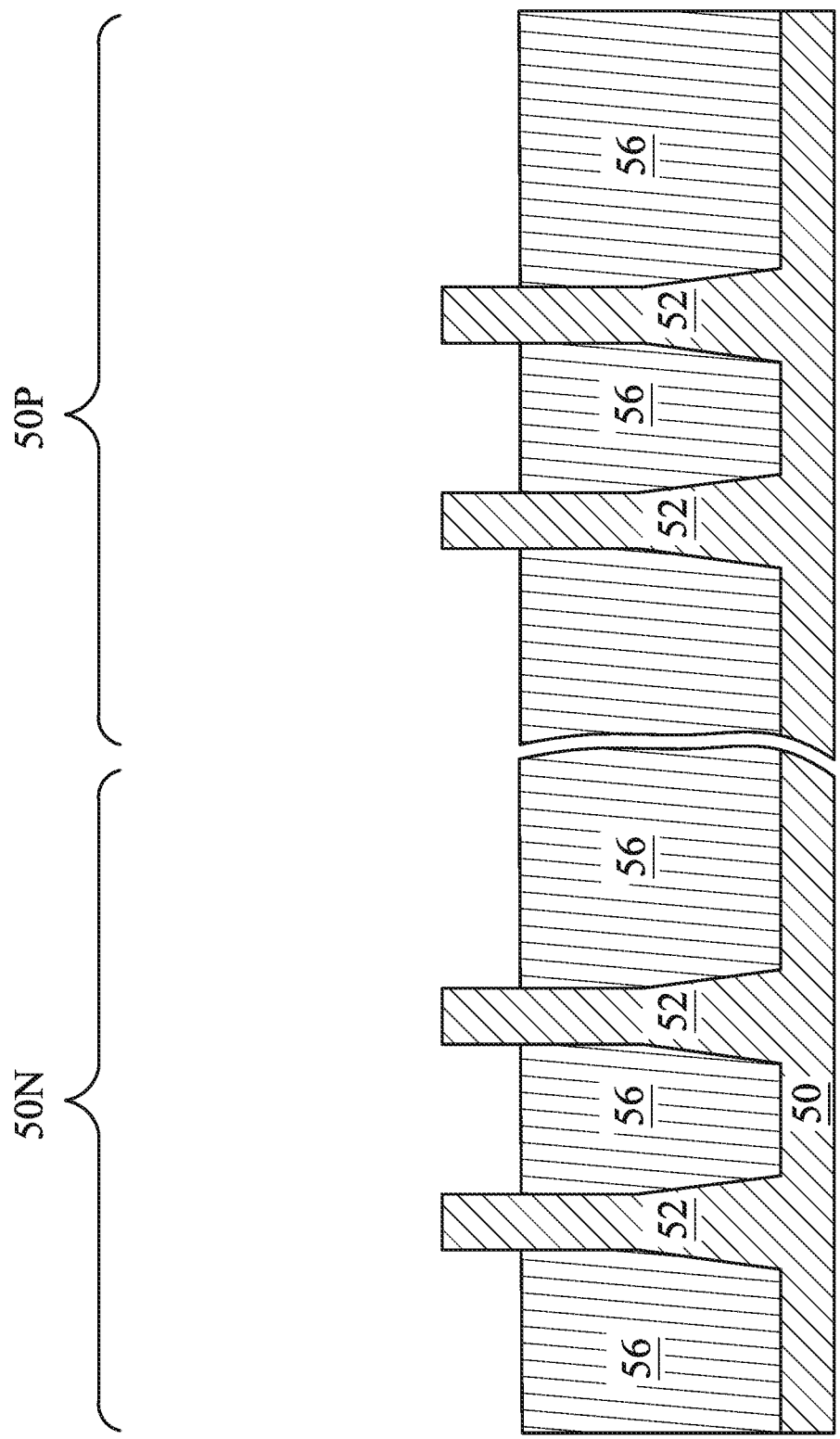

In FIG. 6, the insulation material 54 is recessed to form Shallow Trench Isolation (STI) regions 56. The insulation material 54 is recessed such that upper portions of fins 52 in the region 50N and in the region 50P protrude from between neighboring STI regions 56. Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The STI regions 56 may be recessed using an acceptable etching process, such as one that is selective to the material of the insulation material 54 (e.g., etches the material of the insulation material 54 at a faster rate than the material of the fins 52). For example, an oxide removal using, for example, dilute hydrofluoric (dHF) acid may be used.

The process described with respect to FIGS. 2 through 6 is just one example of how the fins 52 may be formed. In some embodiments, the fins may be formed by an epitaxial growth process. For example, a dielectric layer can be formed over a top surface of the substrate 50, and trenches can be etched through the dielectric layer to expose the underlying substrate 50. Homoepitaxial structures can be epitaxially grown in the trenches, and the dielectric layer can be recessed such that the homoepitaxial structures protrude from the dielectric layer to form fins. Additionally, in some embodiments, heteroepitaxial structures can be used for the fins 52. For example, the fins 52 in FIG. 5 can be recessed, and a material different from the fins 52 may be epitaxially grown over the recessed fins 52. In such embodiments, the fins 52 comprise the recessed material as well as the epitaxially grown material disposed over the recessed material. In an even further embodiment, a dielectric layer can be formed over a top surface of the substrate 50, and trenches can be etched through the dielectric layer. Heteroepitaxial structures can then be epitaxially grown in the trenches using a material different from the substrate 50, and the dielectric layer can be recessed such that the heteroepitaxial structures protrude from the dielectric layer to form the fins 52. In some embodiments where homoepitaxial or heteroepitaxial structures are epitaxially grown, the epitaxially grown materials may be in situ doped during growth, which may obviate prior and subsequent implantations although in situ and implantation doping may be used together.

Still further, it may be advantageous to epitaxially grow a material in region 50N (e.g., an NMOS region) different from the material in region 50P (e.g., a PMOS region). In various embodiments, upper portions of the fins 52 may be formed from silicon-germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, indium arsenide, aluminum arsenide, gallium arsenide, indium phosphide, gallium nitride, indium gallium arsenide, indium aluminum arsenide, gallium antimonide, aluminum antimonide, aluminum phosphide, gallium phosphide, and the like.

Further in FIG. 6, appropriate wells (not shown) may be formed in the fins 52 and/or the substrate 50. In some embodiments, a P well may be formed in the region 50N, and an N well may be formed in the region 50P. In some embodiments, a P well or an N well are formed in both the region 50N and the region 50P.

In the embodiments with different well types, the different implant steps for the region 50N and the region 50P may be achieved using a photoresist or other masks (not shown). For example, a photoresist may be formed over the fins 52 and the STI regions 56 in the region 50N. The photoresist is patterned to expose the region 50P of the substrate 50, such as a PMOS region. The photoresist can be formed by using a spin-on technique and can be patterned using acceptable photolithography techniques. Once the photoresist is patterned, an n-type impurity implant is performed in the region 50P, and the photoresist may act as a mask to substantially prevent n-type impurities from being implanted into the region 50N, such as an NMOS region. The n-type impurities may be phosphorus, arsenic, antimony, or the like implanted in the region to a concentration of equal to or less than $10^{18}$ $cm^{-3}$, such as between about $10^{16}$ $cm^{-3}$ and about $10^{18}$ $cm^{-3}$. After the implant, the photoresist is removed, such as by an acceptable ashing process.

Following the implanting of the region 50P, a photoresist is formed over the fins 52 and the STI regions 56 in the region 50P. The photoresist is patterned to expose the region 50N of the substrate 50, such as the NMOS region. The photoresist can be formed by using a spin-on technique and can be patterned using acceptable photolithography techniques. Once the photoresist is patterned, a p-type impurity implant may be performed in the region 50N, and the photoresist may act as a mask to substantially prevent p-type impurities from being implanted into the region 50P, such as the PMOS region. The p-type impurities may be boron, boron fluoride, indium, or the like implanted in the region to a concentration of equal to or less than $10^{18}$ $cm^{-3}$, such as between about $10^{16}$ $cm^{-3}$ and about $10^{18}$ $cm^{-3}$. After the implant, the photoresist may be removed, such as by an acceptable ashing process.

After the implants of the region 50N and the region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 7:
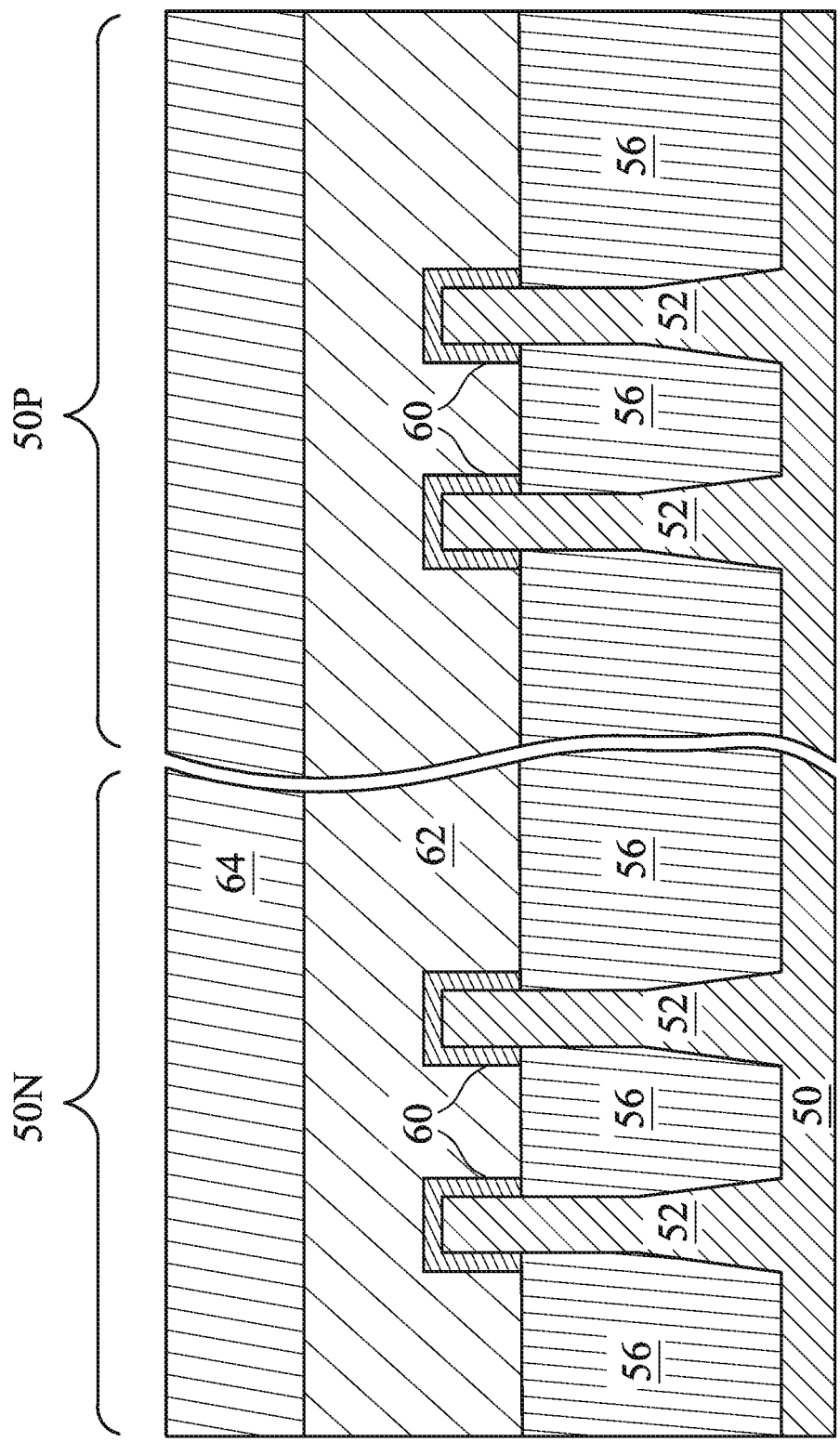

In FIG. 7, a dummy dielectric layer 60 is formed on the fins 52. The dummy dielectric layer 60 may be, for example, silicon oxide, silicon nitride, a combination thereof, or the like, and may be deposited or thermally grown according to acceptable techniques. A dummy gate layer 62 is formed over the dummy dielectric layer 60, and a mask layer 64 is formed over the dummy gate layer 62. The dummy gate layer 62 may be deposited over the dummy dielectric layer 60 and then planarized, such as by a CMP. The mask layer 64 may be deposited over the dummy gate layer 62. The dummy gate layer 62 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 62 may be deposited by physical vapor deposition (PVD), CVD, sputter deposition, or other techniques known and used in the art for depositing the selected material. The dummy gate layer 62 may be made of other materials that have a high etching selectivity from the etching of isolation regions. The mask layer 64 may include, for example, silicon nitride, silicon oxynitride, or the like. In this example, a single dummy gate layer 62 and a single mask layer 64 are formed across the region 50N and the region 50P. It is noted that the dummy dielectric layer 60 is shown covering only the fins 52 for illustrative purposes only. In some embodiments, the dummy dielectric layer 60 may be deposited such that the dummy dielectric layer 60 covers the STI regions 56, extending between the dummy gate layer 62 and the STI regions 56.

FIGS. 8A through 17B illustrate various additional steps in the manufacturing of embodiment devices. FIGS. 8A through 17B illustrate features in either of the region 50N and the region 50P. For example, the structures illustrated in FIGS. 8A through 17B may be applicable to both the region 50N and the region 50P. Differences (if any) in the structures of the region 50N and the region 50P are described in the text accompanying each figure.

Figure 8B:
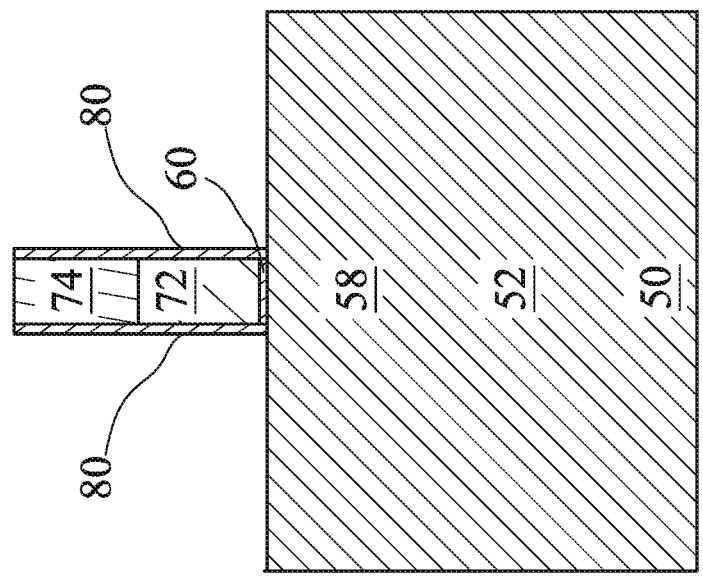
Figure 8A:
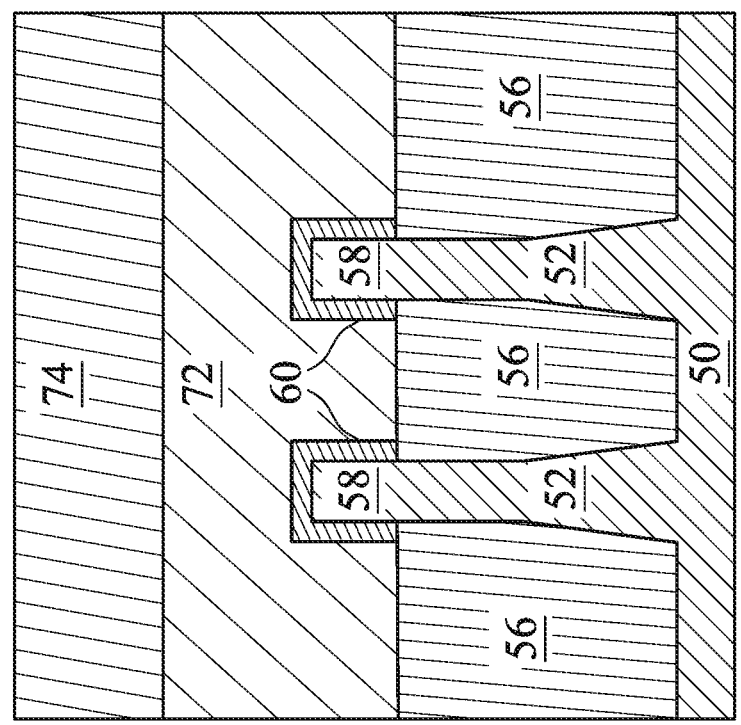

In FIGS. 8A and 8B, the mask layer 64 (see FIG. 7) may be patterned using acceptable photolithography and etching techniques to form masks 74. The pattern of the masks 74 then may be transferred to the dummy gate layer 62. In some embodiments (not illustrated), the pattern of the masks 74 may also be transferred to the dummy dielectric layer 60 by an acceptable etching technique to form dummy gates 72. The dummy gates 72 cover respective channel regions 58 of the fins 52. The pattern of the masks 74 may be used to physically separate each of the dummy gates 72 from adjacent dummy gates. The dummy gates 72 may also have a lengthwise direction substantially perpendicular to the lengthwise direction of respective epitaxial fins 52.

Further in FIGS. 8A and 8B, gate seal spacers 80 can be formed on exposed surfaces of the dummy gates 72, the masks 74, and/or the fins 52. A thermal oxidation or a deposition followed by an anisotropic etch may form the gate seal spacers 80. The gate seal spacers 80 may be formed of silicon oxide, silicon nitride, silicon oxynitride, or the like.

After the formation of the gate seal spacers 80, implants for lightly doped source/drain (LDD) regions (not explicitly illustrated) may be performed. In the embodiments with different device types, similar to the implants discussed above in FIG. 6, a mask, such as a photoresist, may be formed over the region 50N, while exposing the region 50P, and appropriate type (e.g., p-type) impurities may be implanted into the exposed fins 52 in the region 50P. The mask may then be removed. Subsequently, a mask, such as a photoresist, may be formed over the region 50P while exposing the region 50N, and appropriate type impurities (e.g., n-type) may be implanted into the exposed fins 52 in the region 50N. The mask may then be removed. The n-type impurities may be the any of the n-type impurities previously discussed, and the p-type impurities may be the any of the p-type impurities previously discussed. The lightly doped source/drain regions may have a concentration of impurities of from about $10^{15}$ cm$^{-3}$ to about $10^{19}$ cm$^{-3}$. An anneal may be used to repair implant damage and to activate the implanted impurities.

Figure 9B:
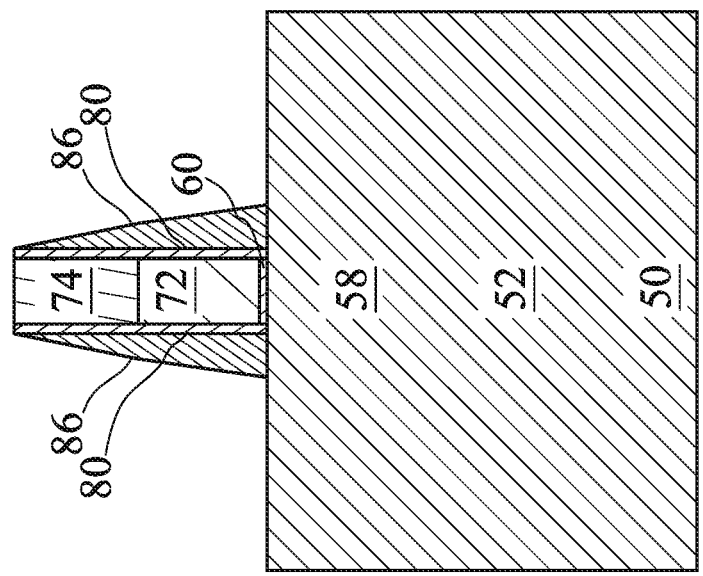
Figure 9A:
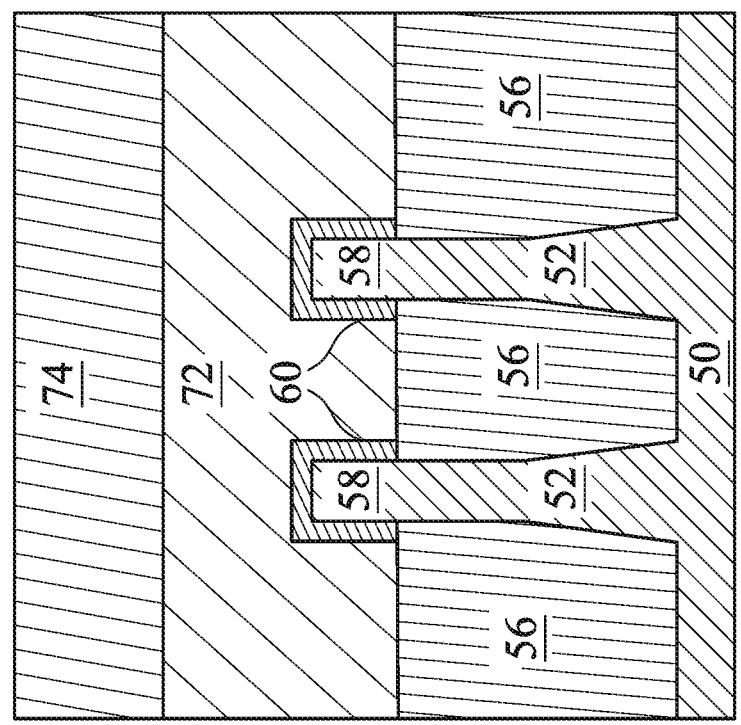

In FIGS. 9A and 9B, gate spacers 86 are formed on the gate seal spacers 80 along sidewalls of the dummy gates 72 and the masks 74. The gate spacers 86 may be formed by conformally depositing an insulating material and subsequently anisotropically etching the insulating material. The insulating material of the gate spacers 86 may be silicon oxide, silicon nitride, silicon oxynitride, silicon carbonitride, a combination thereof, or the like.

It is noted that the above disclosure generally describes a process of forming spacers and LDD regions. Other processes and sequences may be used. For example, fewer or additional spacers may be utilized, different sequence of steps may be utilized (e.g., the gate seal spacers 80 may not be etched prior to forming the gate spacers 86, yielding "L-shaped" gate seal spacers, spacers may be formed and removed, and/or the like. Furthermore, the n-type and p-type devices may be formed using a different structures and steps. For example, LDD regions for n-type devices may be formed prior to forming the gate seal spacers 80 while the LDD regions for p-type devices may be formed after forming the gate seal spacers 80.

Figure 10B:
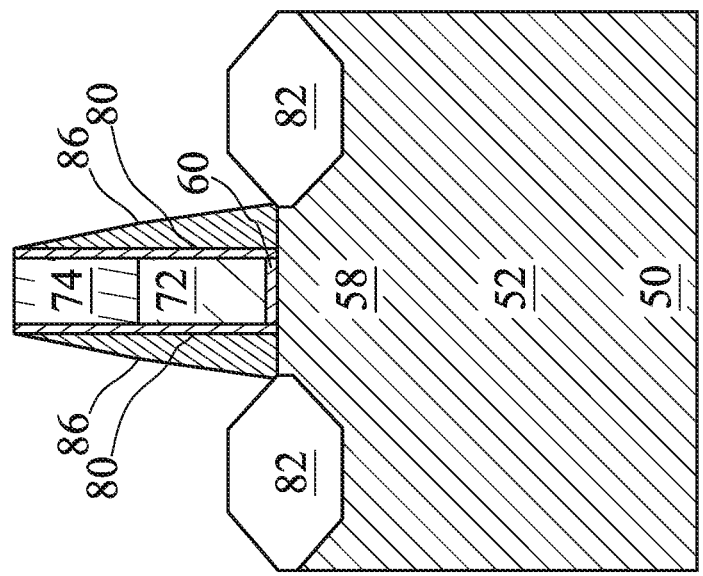
Figure 10A:
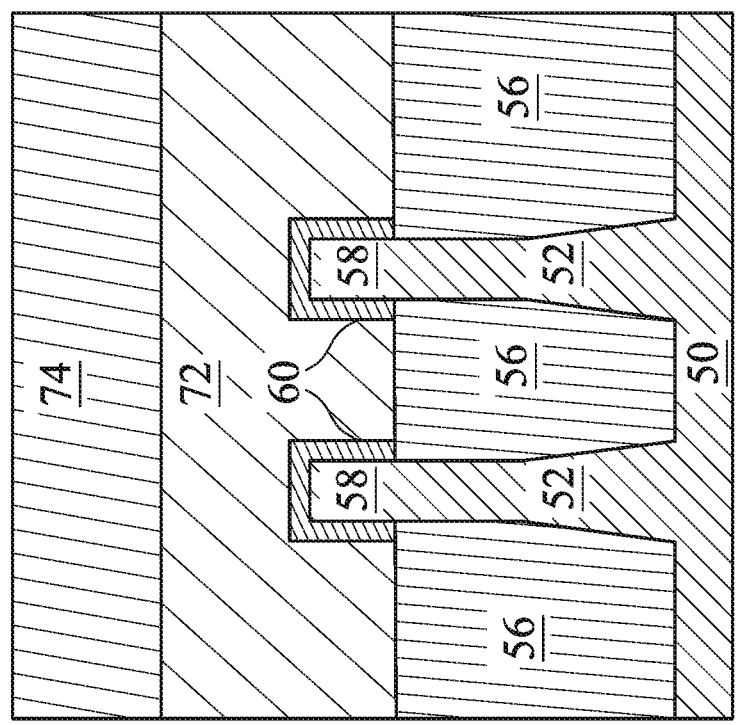
Figure 10C:
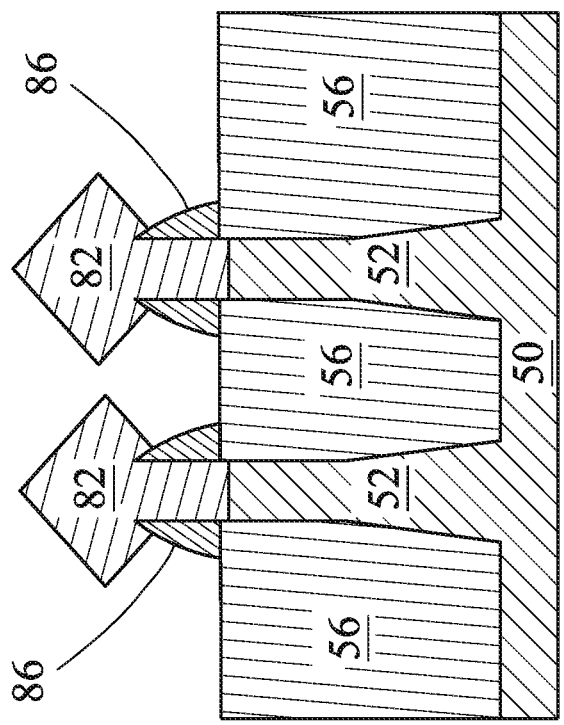
Figure 10D:
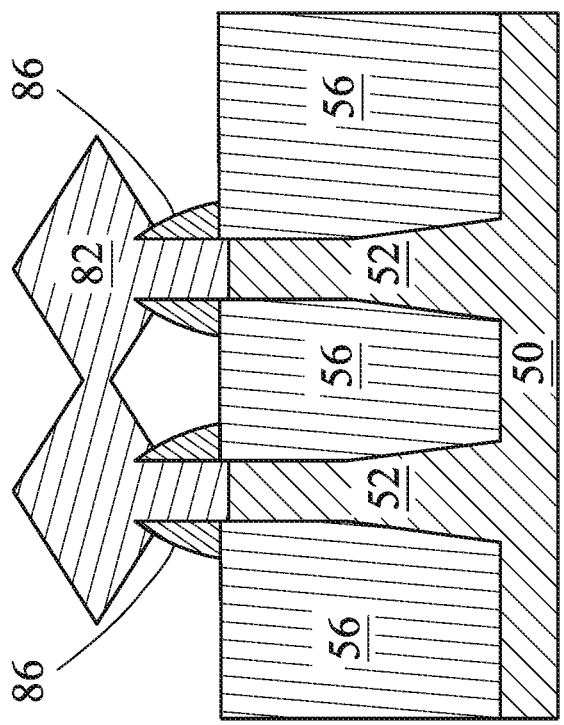

In FIGS. 10A and 10B epitaxial source/drain regions 82 are formed in the fins 52 to exert stress in the respective channel regions 58, thereby improving performance. The epitaxial source/drain regions 82 are formed in the fins 52 such that each dummy gate 72 is disposed between respective neighboring pairs of the epitaxial source/drain regions 82. In some embodiments the epitaxial source/drain regions 82 may extend into, and may also penetrate through, the fins 52. In some embodiments, the gate spacers 86 are used to separate the epitaxial source/drain regions 82 from the dummy gates 72 by an appropriate lateral distance so that the epitaxial source/drain regions 82 do not short out subsequently formed gates of the resulting FinFETs.

The epitaxial source/drain regions 82 in the region 50N, e.g., the NMOS region, may be formed by masking the region 50P, e.g., the PMOS region, and etching source/drain regions of the fins 52 in the region 50N to form recesses in the fins 52. Then, the epitaxial source/drain regions 82 in the region 50N are epitaxially grown in the recesses. The epitaxial source/drain regions 82 may include any acceptable material, such as appropriate for n-type FinFETs. For example, if the fin 52 is silicon, the epitaxial source/drain regions 82 in the region 50N may include materials exerting a tensile strain in the channel region 58, such as silicon, silicon carbide, phosphorous doped silicon carbide, silicon phosphide, or the like. The epitaxial source/drain regions 82 in the region 50N may have surfaces raised from respective surfaces of the fins 52 and may have facets.

The epitaxial source/drain regions 82 in the region 50P, e.g., the PMOS region, may be formed by masking the region 50N, e.g., the NMOS region, and etching source/drain regions of the fins 52 in the region 50P are etched to form recesses in the fins 52. Then, the epitaxial source/drain regions 82 in the region 50P are epitaxially grown in the recesses. The epitaxial source/drain regions 82 may include any acceptable material, such as appropriate for p-type FinFETs. For example, if the fin 52 is silicon, the epitaxial source/drain regions 82 in the region 50P may comprise materials exerting a compressive strain in the channel region 58, such as silicon-germanium, boron doped silicon-germanium, germanium, germanium tin, or the like. The epitaxial source/drain regions 82 in the region 50P may also have surfaces raised from respective surfaces of the fins 52 and may have facets.

The epitaxial source/drain regions 82 and/or the fins 52 may be implanted with dopants to form source/drain regions, similar to the process previously discussed for forming lightly-doped source/drain regions, followed by an anneal. The source/drain regions may have an impurity concentration of between about $10^{19}$ cm$^{-3}$ and about $10^{21}$ cm$^{-3}$. The n-type and/or p-type impurities for source/drain regions may be any of the impurities previously discussed. In some embodiments, the epitaxial source/drain regions 82 may be in situ doped during growth.

As a result of the epitaxy processes used to form the epitaxial source/drain regions 82 in the region 50N and the region 50P, upper surfaces of the epitaxial source/drain regions have facets which expand laterally outward beyond sidewalls of the fins 52. In some embodiments, these facets cause adjacent source/drain regions 82 of a same FinFET to merge as illustrated by FIG. 10C. In other embodiments, adjacent source/drain regions 82 remain separated after the epitaxy process is completed as illustrated by FIG. 10D. In the embodiments illustrated in FIGS. 10C and 10D, gate spacers 86 are formed covering a portion of the sidewalls of the fins 52 that extend above the STI regions 56 thereby blocking the epitaxial growth. In some other embodiments, the spacer etch used to form the gate spacers 86 may be adjusted to remove the spacer material to allow the epitaxially grown region to extend to the surface of the STI region 56.

Figure 11B:
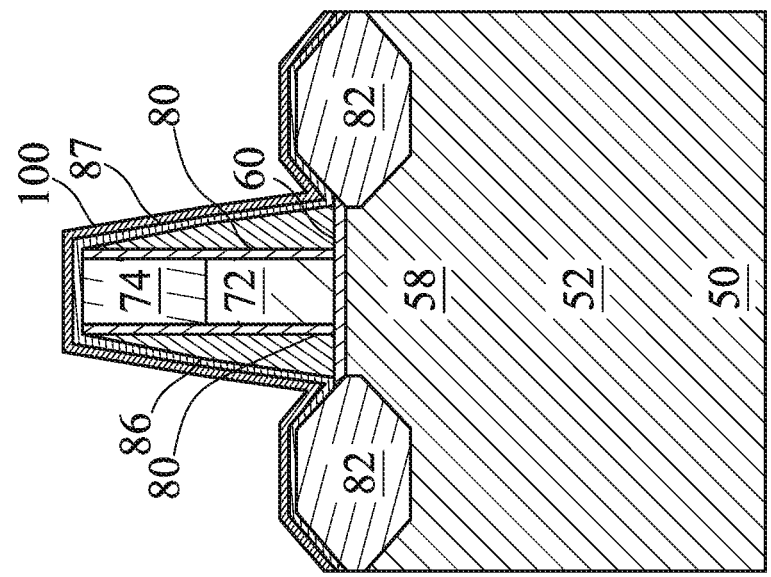
Figure 11A:
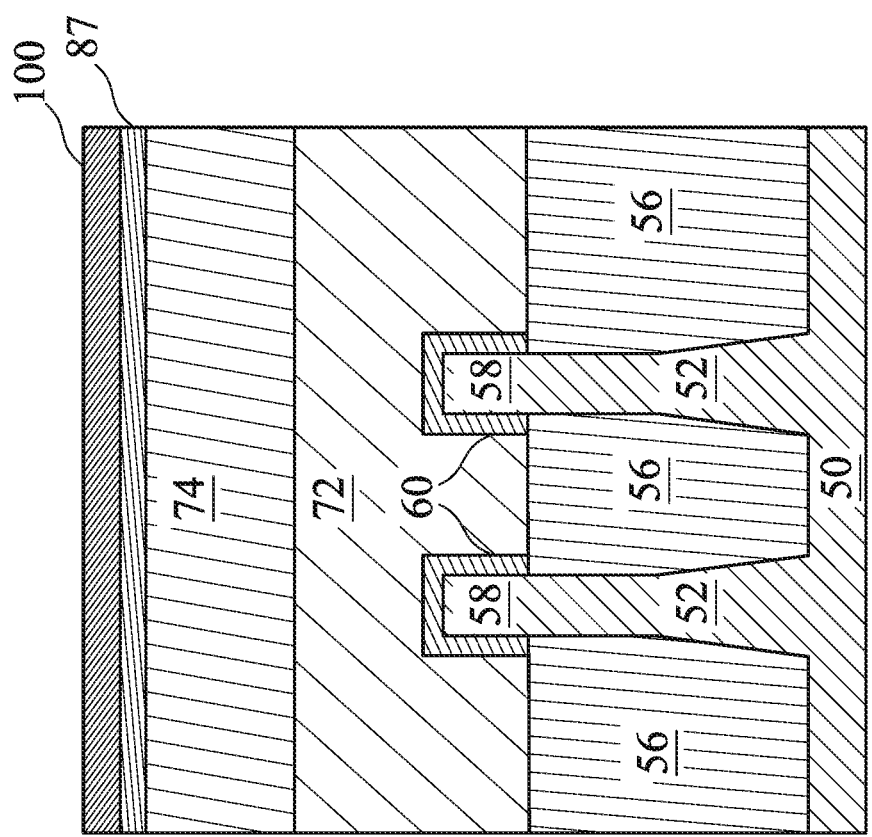

In FIGS. 11A and 11B, a contact etch stop layer (CESL) 87 and a protection layer 100 are formed over the structures illustrated in FIGS. 10A and 10B. The CESL 87 is formed on the epitaxial source/drain regions 82 and acts as an etch stop layer during the etching of the openings for forming source/drain contacts 112 (see FIGS. 17A-B). The CESL 87 may also help protect the epitaxial source/drain regions 82 during subsequent processing steps, such as during the formation of the first ILD 88 (see FIGS. 12A-B). The CESL 87 may comprise a dielectric material, such as silicon nitride, silicon oxide, silicon oxycarbonitride, the like, or combinations thereof and may be formed using ALD, CVD, or another suitable process. The material of the CESL 87 may be chosen to have a different etch rate than the material of the overlying first ILD 88 (see FIGS. 12A-B). For example, the CESL 87 may be silicon nitride and the first ILD 88 may be silicon oxide, although materials other than these may be used. In some embodiments, the CESL 87 may be have a thickness that is between about 2 nm and about 100 nm, though other thicknesses are possible. In some cases, a relatively thin CESL 87 may allow for easier, more controllable, and/or more reproducible etching of the openings for the source/drain contacts 112.

The protection layer 100 is then formed over the CESL 87, in accordance with some embodiments. As stated previously, a relatively thin CESL 87 can allow improved formation of the source/drain contacts 112. However, in some cases, a thinner CESL 87 provides reduced protection of the epitaxial source/drain regions 82. In some embodiments, the protection layer 100 is formed over the CESL 87 to provide additional protection for the epitaxial source/drain regions 82 during subsequent processing steps. For example, the protection layer 100 may protect the epitaxial source/drain regions 82 from oxidation during formation of the first ILD 88 (see FIGS. 12A-B). The use of the protection layer 100 can allow for a relatively thin CESL 87 to be used with less risk of damage (e.g. oxidation) of the epitaxial source/drain regions 82 during subsequent process steps.

In some embodiments, the protection layer 100 comprises silicon oxynitride having a thickness between about 2 nm and about 100 nm, although other thicknesses are possible. For example, the protection layer 100 may comprise silicon oxynitride having an atomic percentage of nitrogen that is between about 1% and about 10%, or may comprise an atomic percentage of oxygen that is between about 40% and about 80%. In some embodiments, the ratio of nitrogen to oxygen in a protection layer 100 formed from silicon oxynitride may be between about 1:6 and about 1:70. Other compositions or proportions of silicon, nitrogen, or oxygen in a protection layer 100 are possible, and in some cases the protection layer 100 may include other atomic species, such as carbon. In some embodiments, an annealing or curing process is performed that reduces the nitrogen concentration of the protection layer 100, described below for FIGS. 12A-B. For example, the use of a silicon oxynitride layer as the protection layer 100 allows the source/drain regions 82 to be protected during formation of the first ILD 88 comprising silicon oxide (see FIGS. 12A-B) and also allows the protection layer to be converted into a layer having a composition more similar, e.g., having similar etch rates, to that of the first ILD 88 (e.g., silicon oxide), thus making some subsequent processing steps, such as etching, easier to perform.

The protection layer 100 may be deposited using a suitable process, such as ALD, CVD, PVD, or the like. For example, in some embodiments, the protection layer 100 is a layer of silicon oxynitride deposited using an ALD process, which may be performed in a process chamber. The ALD process may use suitable precursors of silicon oxynitride, such as $O_2$, $O_3$, $NH_3$, $H_2O$, $N_2$, $N_2H_2$, or the like. In some embodiments, the precursors may be flowed at a rate between about 0.1 sccm and about 10 sccm. Other gases, such as carrier gases, may also be flowed during the ALD process. In some embodiments, the concentration or proportion of nitrogen or oxygen within a silicon oxynitride layer may be controlled by controlling the flow rates or duration of the precursors. For example, the concentration of nitrogen in the silicon oxynitride layer may be increased by increasing the flow rate or duration of nitrogen-producing precursors such as $NH_3$, $N_2$, $N_2H_2$, or the like. The concentration of oxygen in the silicon oxynitride layer may be increased by increasing the flow rate or duration of oxygen-producing precursors such as $O_2$, $H_2O$, $O_3$, or the like. The proportion of nitrogen to oxygen in the silicon oxynitride layer may be controlled by controlling the relative flow rates or durations of the nitrogen-producing precursors and oxygen-producing precursors. For example, a longer duration of oxygen-producing precursor flow may reduce the amount of nitrogen in the formed protection layer 100 (also see the discussion of FIG. 18 below). Other process parameters, materials, or techniques are possible.

Figure 12B:
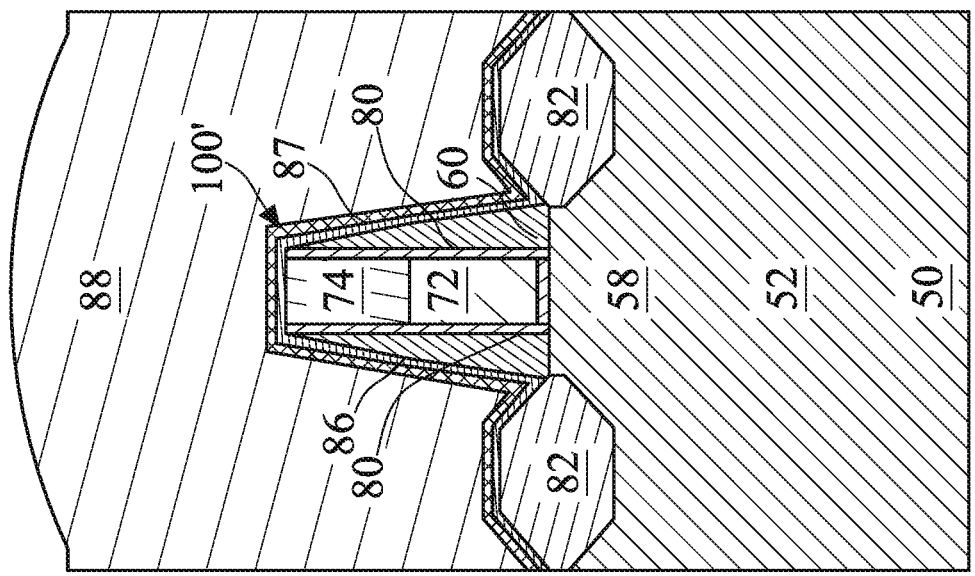
Figure 12A:
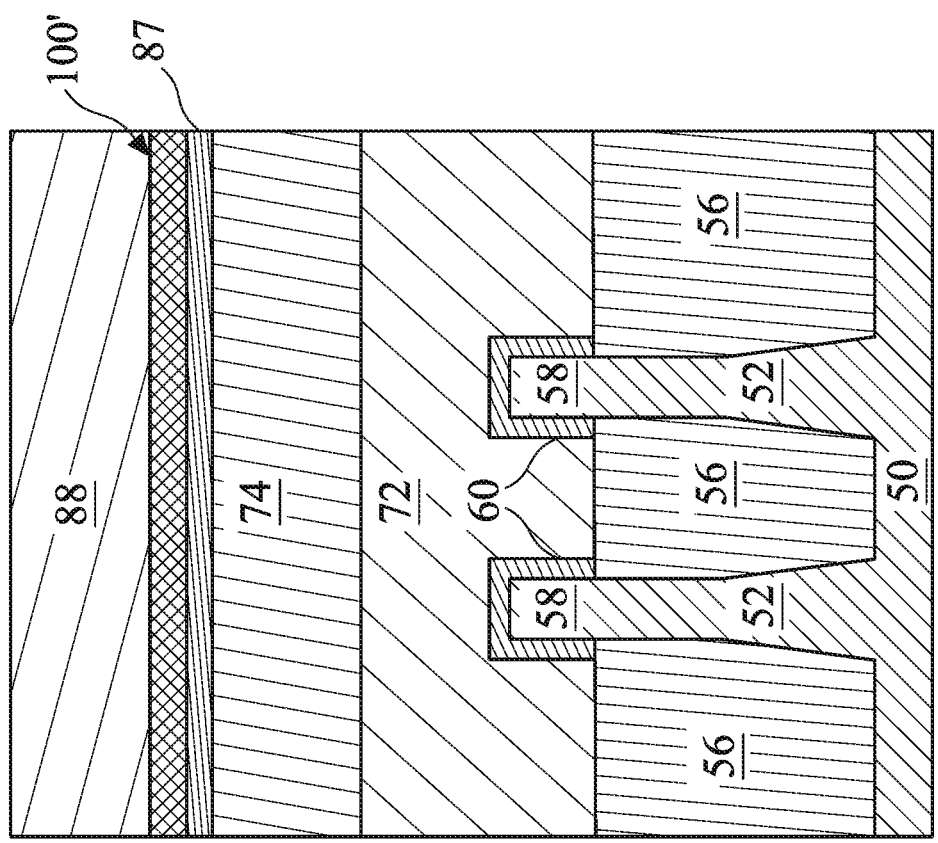

In FIGS. 12A and 12B, a first interlayer dielectric (ILD) 88 is formed over the structure illustrated in FIGS. 11A-B, in accordance with some embodiments. The first ILD 88 may be formed of a dielectric material and may be deposited by any suitable method, such as CVD, plasma-enhanced CVD (PECVD), or FCVD. The first ILD 88 may be formed of a dielectric material such as silicon oxide, phosphosilicate glass (PSG), boro-silicate glass (BSG), boron-doped phospho-silicate glass (BPSG), undoped silicate glass (USG), or the like. For example, in some embodiments, the first ILD 88 is silicon oxide formed using FCVD, in which a CVD-based material is deposited in a remote plasma system and subsequently cured to convert the deposited material into a silicon oxide material. In the illustrated embodiment, the insulation material 54 is silicon oxide formed by a FCVD process. Other dielectric materials formed by any acceptable process may alternatively be used.

In some embodiments, an annealing process is performed to reduce the nitrogen content of the protection layer 100. The annealing process may be performed as the curing step in an FCVD process, or may be performed in addition to a FCVD curing step. The protection layer 100 after performing the annealing process is shown as the converted layer 100' in FIGS. 12A-B. The annealing process may be performed in a suitable process chamber (e.g., a deposition chamber), oven, or the like. In some embodiments, the annealing process is performed at a temperature that is between about 400° C. and about 1000° C. In some embodiments, the annealing process is performed using one or more process gases, which may include argon, $N_2$, $H_2$, steam, $H_2O$, $O_2$, $O_3$ the like, or combinations thereof. The annealing process may be performed for a duration of time between about 0.5 hours and about 4 hours, in some embodiments.

The annealing process removes nitrogen from the protection layer 100, and thus the converted layer 100' has a lower concentration of nitrogen than the protection layer 100. In some cases, the annealing process removes nitrogen by reacting $H_2O$ with the silicon oxynitride to replace nitrogen atoms with oxygen atoms and capture the nitrogen as a reaction product of $NH_3$, which can be purged from the process chamber. For example, in some embodiments, the protection layer 100 is silicon oxynitride having a first atomic percentage of nitrogen and the converted layer 100' is silicon oxynitride having a second atomic percentage of nitrogen that is less than the first atomic percentage of nitrogen. In some embodiments, the annealing process may form a converted layer 100' that has less than about half of the amount of nitrogen in the initial protection layer 100. For example, the converted layer 100' may have between 0% and about 5% of the amount of nitrogen in the initial protection layer 100.

Figure 18:
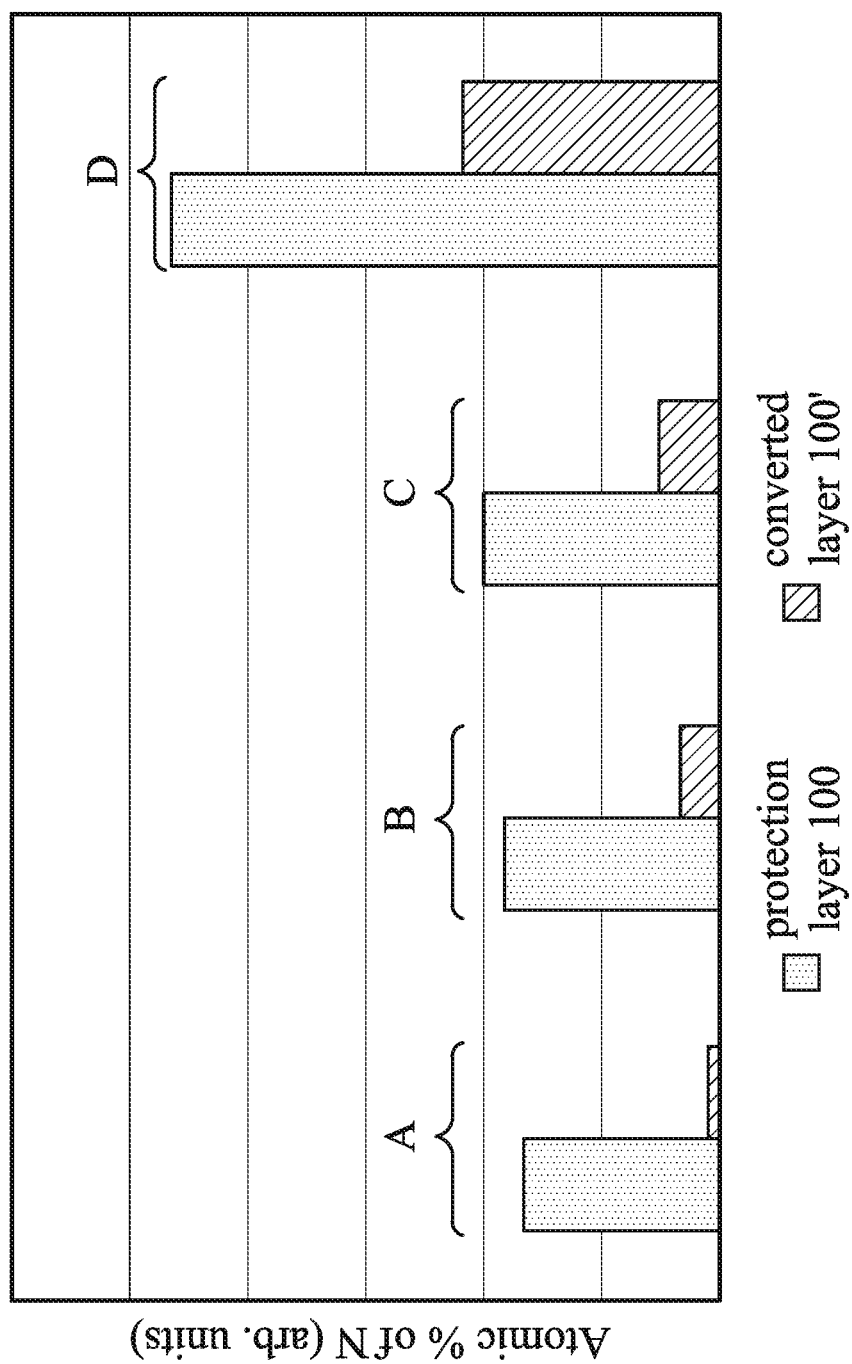
FIGS. 18 and 19 show experimental data from the conversion of a protection layer to a converted layer, in accordance with some embodiments.

This is shown in FIG. 18, which shows experimental data of the atomic percentage of nitrogen in four sample protection layers A, B, C, and D, and in the corresponding converted layers A, B, C, and D after performing the annealing process. As shown in FIG. 18, the annealing process reduces the atomic percentage of nitrogen in the protection layer 100. For example, the converted layer of sample A has only about 5.6% of the atomic percentage of nitrogen present in the initial protection layer of sample A. Similarly, the converted layers of samples B, C, and D, respectively have about 15.8%, about 20%, and about 47.8% of the atomic percentage of nitrogen present in their initial protection layers. In this manner, a converted layer may have an atomic percentage of nitrogen that is less than one-fifth of the atomic percentage of nitrogen of the initial protection layer. The amount of nitrogen in a converted layer 100' may depend on the amount of nitrogen in the initial protection layer 100 or on the parameters of the annealing process. For example, an annealing process using a longer duration and/or a higher temperature may remove more nitrogen than an annealing process using a shorter duration and/or a lower temperature. These are examples, and other results are possible.

Additionally, FIG. 18 shows how controlling the exposure of different precursors can be used to control the concentration of nitrogen in the protection layer 100. For example, the formation of the protection layer of sample A used a longer duration of oxygen precursor flow than the formation of the protection layers of samples B, C, or D. Because of the increased duration of oxygen precursor flow, the protection layer (and the converted layer) of sample A has the smallest atomic percentage of nitrogen of the four samples. As another example, sample D had the shortest duration of oxygen precursor flow of the four samples and consequently has the greatest atomic percentage of nitrogen. These are examples, and other results or techniques for controlling layer composition are possible.

Figure 19:
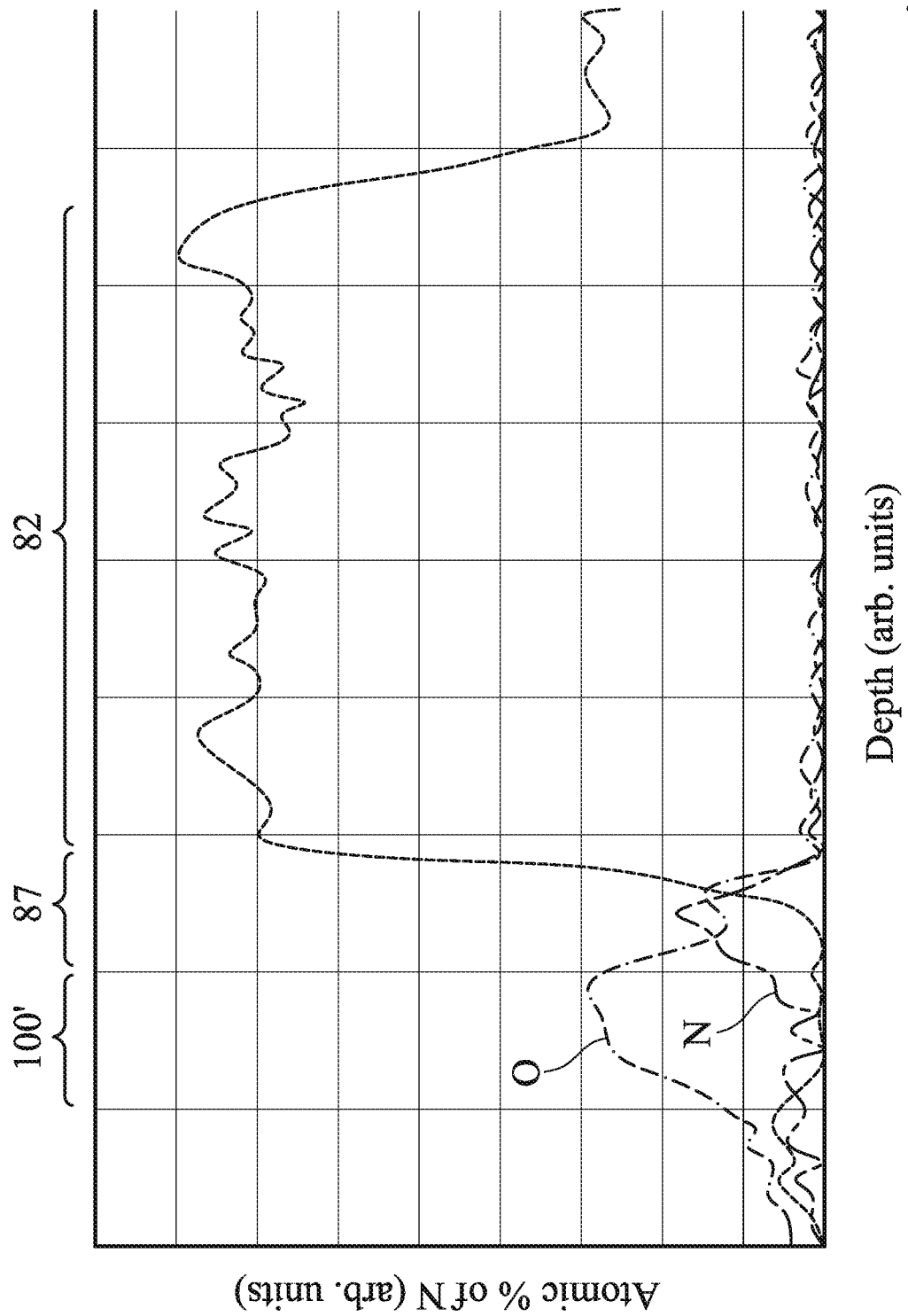

By converting the protection layer 100 into the converted layer 100' using the annealing process, the effect on subsequent processing steps of the protection layer 100 can be reduced. For example, by reducing the nitrogen content of the protection layer 100 using the annealing process, the remaining converted layer 100' may be more easily etched, such as during the formation of the openings for the source/drain contacts 112 (see FIGS. 17A-B). In some cases, by converting the protection layer 100 into the converted layer 100', the protection layer 100 does not significantly act as an additional etch stop layer, and thus the benefits of a thin CESL 87 are preserved. In this manner, the epitaxial source/drain regions 82 can be protected from oxidation even when a thin CESL 87 is used. For example, FIG. 19 shows experimental data of the relative concentrations of several atomic species versus depth after formation of the ILD 88. As shown in FIG. 19, the concentration of oxygen within the epitaxial source/drain region 82 is small, indicating reduced oxidation due to the presence of the protection layer 100 (e.g., the converted layer 100' in FIG. 19).

Figure 13B:
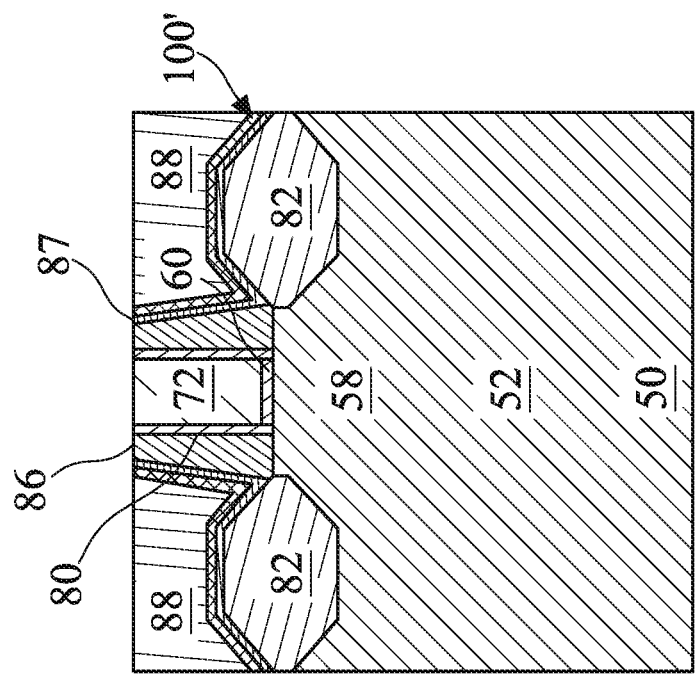
Figure 13A:
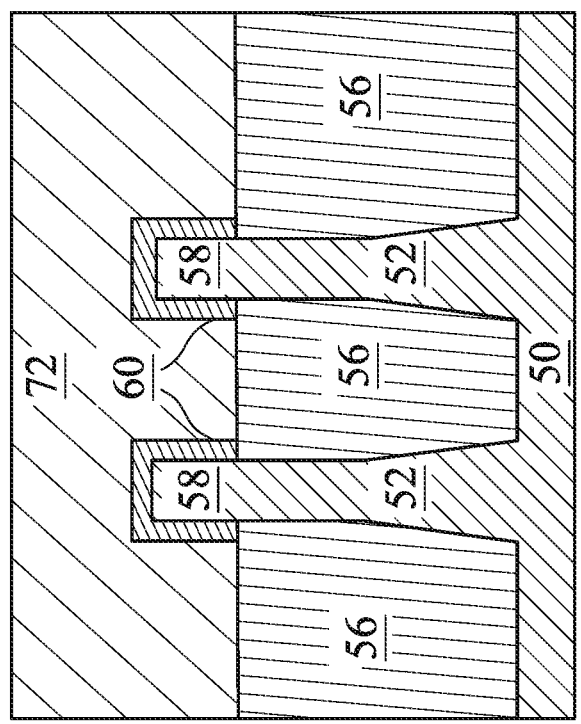

Turning to FIGS. 13A and 13B, a planarization process, such as a CMP, may be performed to level the top surface of the first ILD 88 with the top surfaces of the dummy gates 72 or the masks 74. The planarization process may also remove the masks 74 on the dummy gates 72, and portions of the gate seal spacers 80 and the gate spacers 86 along sidewalls of the masks 74. After the planarization process, top surfaces of the dummy gates 72, the gate seal spacers 80, the gate spacers 86, and the first ILD 88 are level. Accordingly, the top surfaces of the dummy gates 72 are exposed through the first ILD 88. In some embodiments, the masks 74 may remain, in which case the planarization process levels the top surface of the first ILD 88 with the top surfaces of the top surface of the masks 74.

Figure 14B:
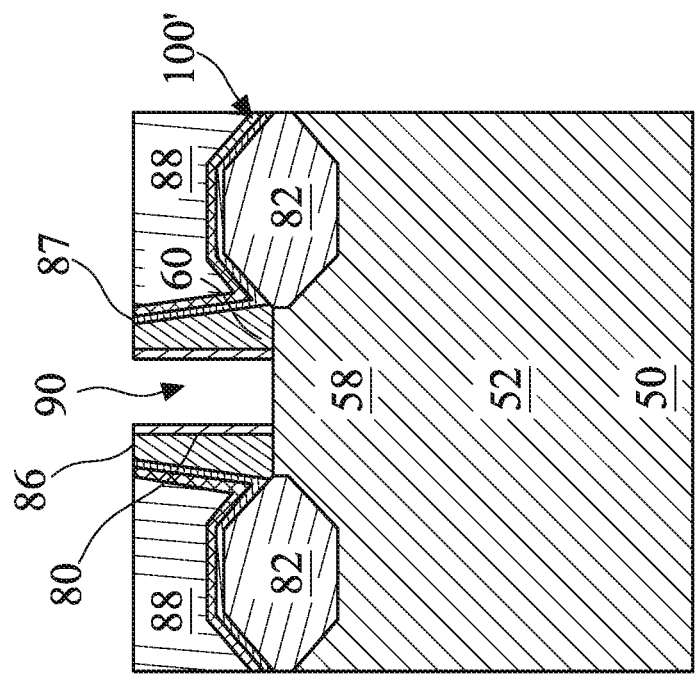
Figure 14A:
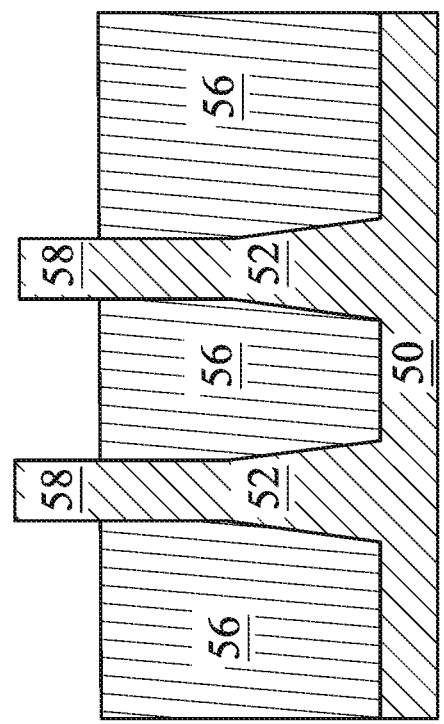

In FIGS. 14A and 14B, the dummy gates 72, and the masks 74 if present, are removed in an etching step(s), so that recesses 90 are formed. Portions of the dummy dielectric layer 60 in the recesses 90 may also be removed. In some embodiments, only the dummy gates 72 are removed and the dummy dielectric layer 60 remains and is exposed by the recesses 90. In some embodiments, the dummy dielectric layer 60 is removed from recesses 90 in a first region of a die (e.g., a core logic region) and remains in recesses 90 in a second region of the die (e.g., an input/output region). In some embodiments, the dummy gates 72 are removed by an anisotropic dry etch process. For example, the etching process may include a dry etch process using reaction gas(es) that selectively etch the dummy gates 72 without etching the first ILD 88 or the gate spacers 86. Each recess 90 exposes and/or overlies a channel region 58 of a respective fin 52. Each channel region 58 is disposed between neighboring pairs of the epitaxial source/drain regions 82. During the removal, the dummy dielectric layer 60 may be used as an etch stop layer when the dummy gates 72 are etched. The dummy dielectric layer 60 may then be optionally removed after the removal of the dummy gates 72.

Figure 15A:
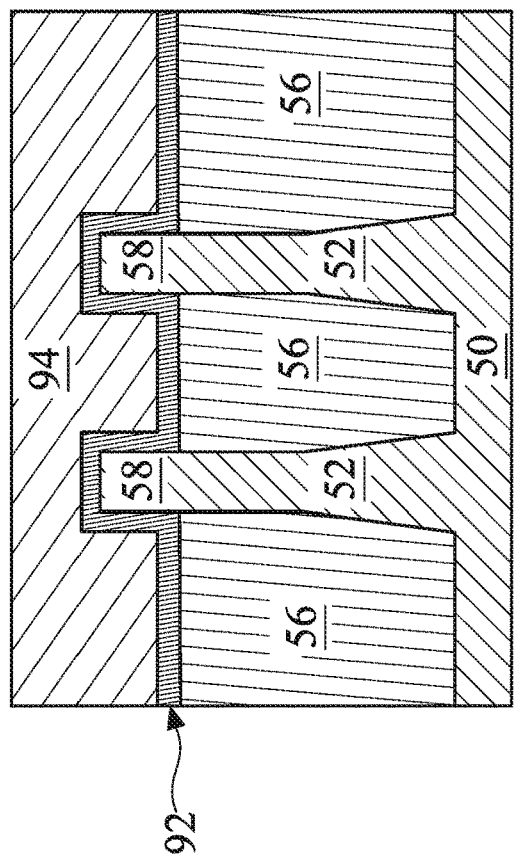
Figure 15B:
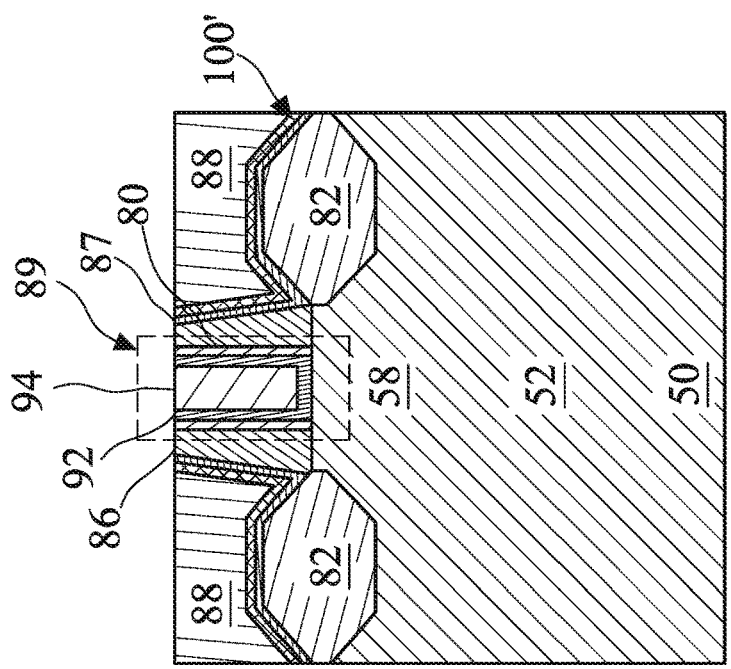
Figure 15C:
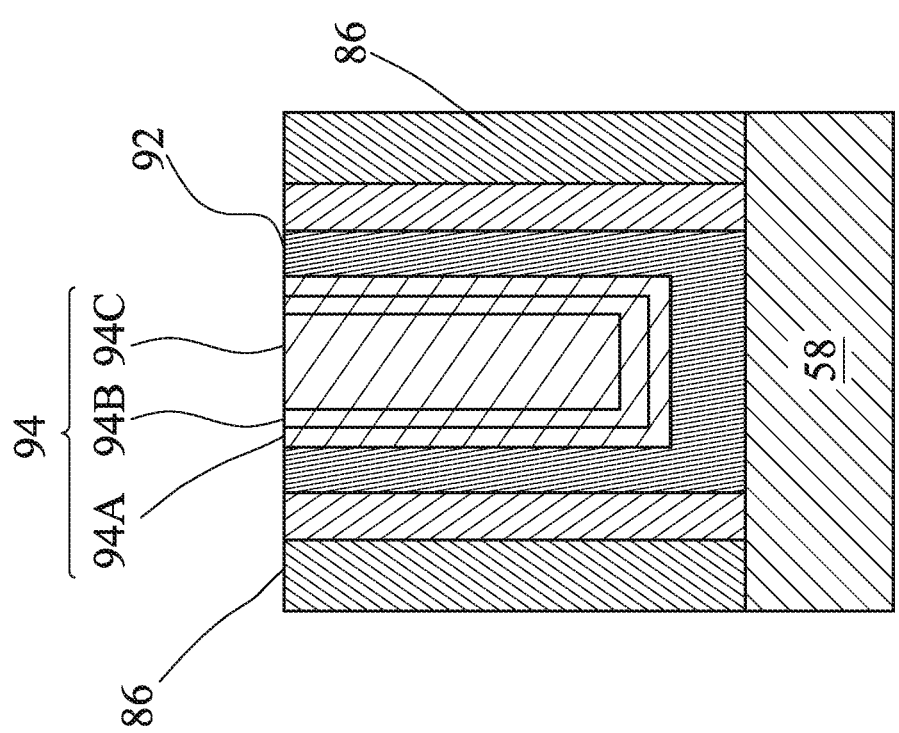

In FIGS. 15A and 15B, gate dielectric layers 92 and gate electrodes 94 are formed for replacement gates. FIG. 15C illustrates a detailed view of region 89 of FIG. 15B. Gate dielectric layers 92 are deposited conformally in the recesses 90, such as on the top surfaces and the sidewalls of the fins 52 and on sidewalls of the gate seal spacers 80/gate spacers 86. The gate dielectric layers 92 may also be formed on the top surface of the first ILD 88. In accordance with some embodiments, the gate dielectric layers 92 comprise silicon oxide, silicon nitride, or multilayers thereof. In some embodiments, the gate dielectric layers 92 include a high-k dielectric material, and in these embodiments, the gate dielectric layers 92 may have a k value greater than about 7.0, and may include a metal oxide or a silicate of hafnium, aluminum, zirconium, lanthanum, manganese, barium, titanium, lead, and combinations thereof. The formation methods of the gate dielectric layers 92 may include Molecular-Beam Deposition (MBD), ALD, PECVD, and the like. In embodiments where portions of the dummy gate dielectric 60 remains in the recesses 90, the gate dielectric layers 92 include a material of the dummy gate dielectric 60 (e.g., $SiO_2$).

The gate electrodes 94 are deposited over the gate dielectric layers 92, respectively, and fill the remaining portions of the recesses 90. The gate electrodes 94 may include a metal-containing material such as titanium nitride, titanium oxide, tantalum nitride, tantalum carbide, cobalt, ruthenium, aluminum, tungsten, combinations thereof, or multi-layers thereof. For example, although a single layer gate electrode 94 is illustrated in FIG. 15B, the gate electrode 94 may comprise any number of liner layers 94A, any number of work function tuning layers 94B, and a fill material 94C as illustrated by FIG. 15C. After the filling of the recesses 90, a planarization process, such as a CMP, may be performed to remove the excess portions of the gate dielectric layers 92 and the material of the gate electrodes 94, which excess portions are over the top surface of the ILD 88. The remaining portions of material of the gate electrodes 94 and the gate dielectric layers 92 thus form replacement gates of the resulting FinFETs. The gate electrodes 94 and the gate dielectric layers 92 may be collectively referred to as a "gate stack." The gate and the gate stacks may extend along sidewalls of a channel region 58 of the fins 52.

The formation of the gate dielectric layers 92 in the region 50N and the region 50P may occur simultaneously such that the gate dielectric layers 92 in each region are formed from the same materials, and the formation of the gate electrodes 94 may occur simultaneously such that the gate electrodes 94 in each region are formed from the same materials. In some embodiments, the gate dielectric layers 92 in each region may be formed by distinct processes, such that the gate dielectric layers 92 may be different materials, and/or the gate electrodes 94 in each region may be formed by distinct processes, such that the gate electrodes 94 may be different materials. Various masking steps may be used to mask and expose appropriate regions when using distinct processes.

Figure 16B:
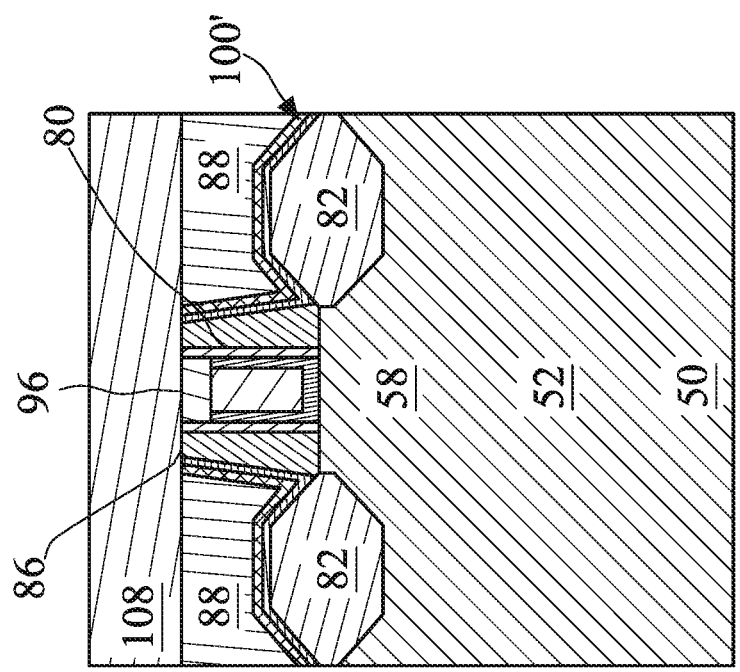
Figure 16A:
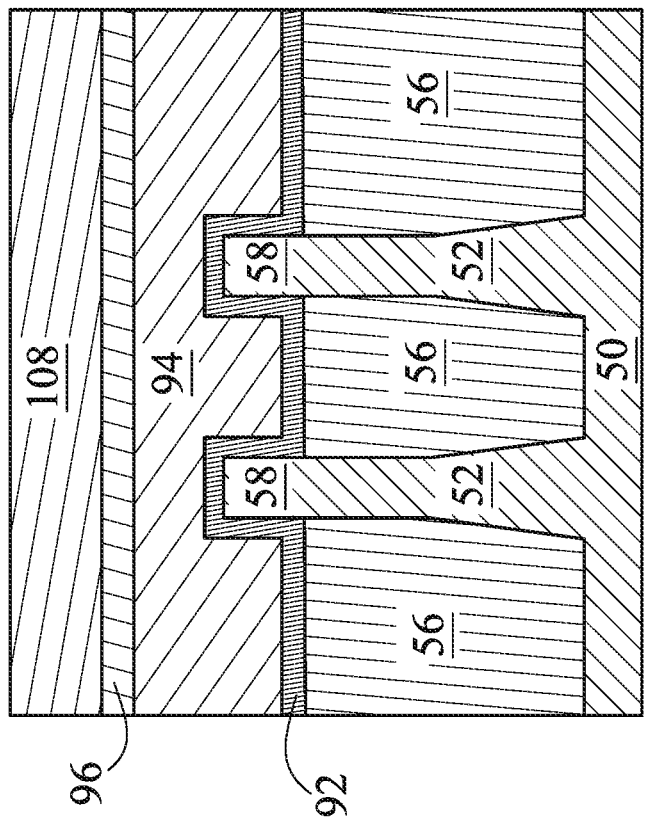

In FIGS. 16A and 16B, a second ILD 108 is deposited over the first ILD 88. In some embodiment, the second ILD 108 is a flowable film formed by a flowable CVD (FCVD) method. In some embodiments, the second ILD 108 is formed of a dielectric material such as PSG, BSG, BPSG, USG, or the like, and may be deposited by any suitable method, such as CVD and PECVD. In accordance with some embodiments, before the formation of the second ILD 108, the gate stack (including a gate dielectric layer 92 and a corresponding overlying gate electrode 94) is recessed, so that a recess is formed directly over the gate stack and between opposing portions of gate spacers 86, as illustrated in FIGS. 16A and 16B. A gate mask 96 comprising one or more layers of dielectric material, such as silicon nitride, silicon oxynitride, or the like, is filled in the recess, followed by a planarization process to remove excess portions of the dielectric material extending over the first ILD 88. The subsequently formed gate contacts 110 (FIGS. 17A and 17B) penetrate through the gate mask 96 to contact the top surface of the recessed gate electrode 94.

Figure 17B:
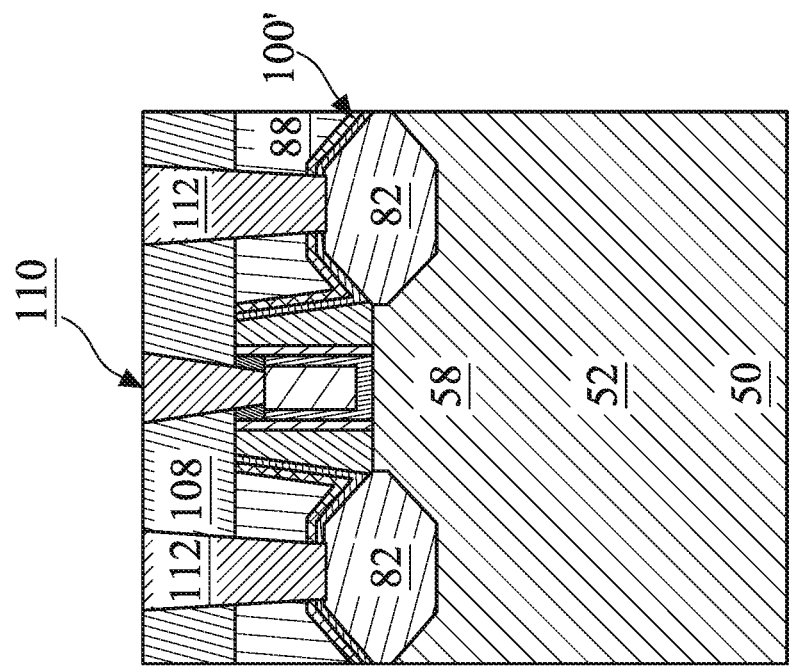
Figure 17A:
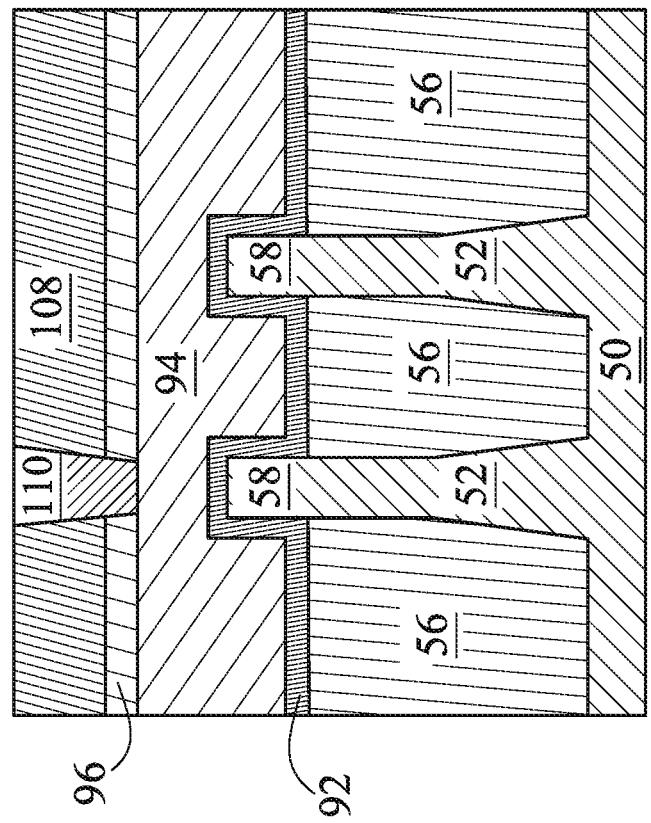

In FIGS. 17A and 17B, gate contacts no and source/drain contacts 112 are formed through the second ILD 108 and the first ILD 88 in accordance with some embodiments. Openings for the gate contact no are formed through the second ILD 108 and the gate mask 96. Openings for the source/drain contacts 112 are formed through the first and second ILDs 88 and 108 and the CESL 87. The openings for the source/drain contacts 112 also extend through the converted layer 100'. The openings may be formed using acceptable photolithography and etching techniques. For example, the openings may be etched using one or more suitable anisotropic dry etching processes. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the ILD 108. The remaining liner and conductive material form the source/drain contacts 112 and gate contacts no in the openings. An anneal process may be performed to form a silicide at the interface between the epitaxial source/drain regions 82 and the source/drain contacts 112. The source/drain contacts 112 are physically and electrically coupled to the epitaxial source/drain regions 82, and the gate contacts no are physically and electrically coupled to the gate electrodes 94. The source/drain contacts 112 and gate contacts no may be formed in different processes, or may be formed in the same process. Although shown as being formed in the same cross-sections, it should be appreciated that each of the source/drain contacts 112 and gate contacts no may be formed in different cross-sections, which may avoid shorting of the contacts.

The embodiments herein may achieve advantages. The use of a protection layer over the source/drain regions as described herein can reduce damage to the source/drain regions during subsequent processing steps. For example, the protection layer can reduce or prevent oxidation of the source/drain regions during the formation of an ILD layer. The use of a protection layer can also allow for a thinner contact etch stop layer to be formed without increased risk of damage to the source/drain regions. In some cases, a thinner contact etch stop layer can allow for easier or more reproducible formation of contacts to the source/drain regions. Additionally, an annealing process can be performed to convert the protection layer into a converted layer having less nitrogen. For example, a protection layer of silicon oxynitride may be converted to a conversion layer of silicon oxide or to a conversion layer of silicon oxynitride with a smaller concentration of nitrogen. Reducing the nitrogen content of the protection layer in this manner can also allow for easier or more reproducible formation of contacts to the source/drain regions.

In accordance with an embodiment, a method includes forming a fin extending from a substrate; forming an first isolation region along opposing sidewalls of the fin; forming a gate structure over the fin; forming an epitaxial source/drain region in the fin adjacent the gate structure; forming an etch stop layer over the epitaxial source/drain region and over the gate structure; forming a protection layer over the etch stop layer, the protection layer including silicon oxynitride; and forming a second isolation material over the protection layer, wherein forming the second isolation material reduces a nitrogen concentration of the protection layer. In an embodiment, the second isolation material includes silicon oxide. In an embodiment, forming the protection layer includes using an atomic layer deposition (ALD) process. In an embodiment, after forming the second isolation material, the protection layer has an atomic percentage of nitrogen that is less than 10%. In an embodiment, forming the second isolation material includes performing an anneal process that converts the protection layer from silicon oxynitride to silicon oxide. In an embodiment, the protection layer has a thickness between 1 nm and 3 nm. In an embodiment, forming the second isolation material includes a flowable chemical vapor deposition (FCVD) process. In an embodiment, the method includes forming an opening extending through the second isolation material, the protection layer, and the etch stop layer to expose the epitaxial source/drain region, and depositing a conductive material within the opening.

In accordance with an embodiment, a method of forming a semiconductor device includes forming a semiconductor fin protruding from a substrate; forming a gate stack over the semiconductor fin; forming a source/drain region on the semiconductor fin adjacent the gate stack; forming a first dielectric layer extending over the source/drain region and the gate stack; forming a second dielectric layer on the first dielectric layer, wherein the second dielectric layer is a different material than the first dielectric layer, wherein the second dielectric layer is formed having a first atomic percentage of nitrogen; forming an insulating layer on the second dielectric layer, wherein the insulating layer is a different material than the second dielectric layer; performing an annealing process, wherein the second dielectric layer has a second atomic percentage of nitrogen after performing the annealing process that is smaller than the first atomic percentage of nitrogen; and after performing the annealing process, forming a conductive feature extending through the insulating layer, the second dielectric layer, and the first dielectric layer to contact the source/drain region. In an embodiment, the first dielectric layer is silicon nitride. In an embodiment, the first dielectric layer has a thickness between 2 nm and 100 nm. In an embodiment, the annealing process is performed at a temperature between 400° C. and 1000° C. In an embodiment, the second dielectric layer is silicon oxynitride, and the first atomic percentage of nitrogen is between 1% and 20%. In an embodiment, the second atomic percentage of nitrogen is less than one-fifth of the first atomic percentage of nitrogen. In an embodiment, the insulating layer is silicon oxide.

In accordance with an embodiment, a device includes a fin extending from a semiconductor substrate; a gate stack over and along a sidewall of the fin; a gate spacer along a sidewall of the gate stack and a sidewall of the fin; an epitaxial source/drain region in the fin and adjacent the gate stack; a silicon nitride layer extending over the epitaxial source/drain region and the gate spacer; a silicon oxynitride layer on the silicon nitride layer; an insulating layer on the silicon oxynitride layer; and a contact extending through the insulating layer, the silicon oxynitride layer, and the silicon nitride layer to the epitaxial source/drain region. In an embodiment, the insulating layer includes silicon oxide. In an embodiment, the silicon oxynitride layer is thicker than the silicon nitride layer. In an embodiment, the silicon oxynitride layer has a thickness between 1 nm and 3 nm. In an embodiment, the silicon oxynitride layer has an atomic concentration of nitrogen that is between 1% and 20%.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a fin extending from a substrate;
   forming an first isolation material along opposing sidewalls of the fin;
   forming a dummy gate structure over the fin;
   forming an epitaxial source/drain region in the fin adjacent the dummy gate structure;
   forming an etch stop layer over the epitaxial source/drain region and over the dummy gate structure;
   forming a protection layer over the etch stop layer, the protection layer comprising silicon oxynitride;
   forming a second isolation material over the protection layer, wherein forming the second isolation material comprises performing an anneal process that reduces a nitrogen concentration of the protection layer, wherein the anneal process comprises controlling an anneal temperature or an anneal duration so that the nitrogen concentration in the protection layer is reduced by at least eighty-percent; and
   after performing the anneal process, replacing the dummy gate structure with a replacement gate structure.

2. The method of claim 1, wherein the second isolation material comprises silicon oxide.

3. The method of claim 1, wherein forming the protection layer comprises using an atomic layer deposition (ALD) process.

4. The method of claim 1, wherein, after forming the second isolation material, the protection layer has an atomic percentage of nitrogen that is less than 10%.

5. The method of claim 1, wherein the anneal process converts the protection layer from silicon oxynitride to silicon oxide.

6. The method of claim 1, wherein the protection layer has a thickness between 1 nm and 3 nm.

7. The method of claim 1, wherein forming the second isolation material comprises a flowable chemical vapor deposition (FCVD) process.

8. The method of claim 1, further comprising forming an opening extending through the second isolation material, the protection layer, and the etch stop layer to expose the epitaxial source/drain region, and depositing a conductive material within the opening.

9. A method of forming a semiconductor device, the method comprising:
   forming a semiconductor fin protruding from a substrate;
   forming a gate stack over the semiconductor fin;
   forming a source/drain region on the semiconductor fin adjacent the gate stack;
   forming a first dielectric layer extending over the source/drain region and over a topmost surface of the gate stack;
   forming a second dielectric layer on the first dielectric layer, wherein the second dielectric layer is a different material than the first dielectric layer, wherein the second dielectric layer is formed having a first atomic percentage of nitrogen, wherein the first dielectric layer and the second dielectric layer extend over the topmost surface of the gate stack after forming the second dielectric layer;
   forming an insulating layer on the second dielectric layer, wherein the insulating layer is a different material than the second dielectric layer;
   performing an annealing process, wherein the second dielectric layer has a second atomic percentage of nitrogen after performing the annealing process that is less than one-fifth of the first atomic percentage of nitrogen; and
   after performing the annealing process, forming a conductive feature extending through the insulating layer, the second dielectric layer, and the first dielectric layer to contact the source/drain region.

10. The method of claim 9, wherein the first dielectric layer is silicon nitride.

11. The method of claim 9, wherein the first dielectric layer has a thickness between 2 nm and 100 nm.

12. The method of claim 9, wherein the annealing process is performed at a temperature between 400° C. and 1000° C.

13. The method of claim 9, wherein the second dielectric layer is silicon oxynitride, and wherein the first atomic percentage of nitrogen is between 1% and 20%.

14. The method of claim 9, wherein the insulating layer is silicon oxide.

15. A method comprising:
   forming a fin extending from a semiconductor substrate;
   forming a dummy gate stack over and along a sidewall of the fin;
   forming an epitaxial source/drain region in the fin adjacent the dummy gate stack;
   depositing a silicon nitride layer on the epitaxial source/drain region;
   depositing a silicon oxynitride layer on the silicon nitride layer;
   depositing an insulating layer on the silicon oxynitride layer;
   after depositing the insulating layer, converting an upper portion of the silicon oxynitride layer to a converted layer using an anneal process, wherein the converted layer comprises silicon and oxygen, and wherein the converted layer has a first atomic percentage of nitrogen that is less than one-fifth of a second atomic percentage of nitrogen of the silicon oxynitride layer;

after converting the upper portion of the silicon oxynitride layer to the converted layer, replacing the dummy gate stack with a replacement gate stack; and forming a contact extending through the insulating layer, the converted layer, the silicon oxynitride layer, and the silicon nitride layer to the epitaxial source/drain region.

16. The method of claim 15, wherein the insulating layer comprises silicon oxide.

17. The method of claim 15, wherein the silicon oxynitride layer is thicker than the silicon nitride layer.

18. The method of claim 15, wherein the silicon oxynitride layer has a thickness between 1 nm and 3 nm.

19. The method of claim 15, wherein depositing the insulating layer comprises a flowable chemical vapor deposition (FCVD) process and a curing process, wherein the anneal process is the curing process.

20. The method of claim 15, wherein the anneal process comprises:

reacting water with nitrogen atoms of the silicon oxynitride layer to produce $NH_3$; and purging the $NH_3$ from a process chamber in which the anneal process is performed.

* * * * *